(12) United States Patent
Lell et al.

(10) Patent No.: US 10,693,033 B2
(45) Date of Patent: Jun. 23, 2020

(54) SEMICONDUCTOR CHIP AND METHOD FOR PRODUCING A SEMICONDUCTOR CHIP

(71) Applicant: OSRAM OLED GMBH, Regensburg (DE)

(72) Inventors: Alfred Lell, Maxhütte-Haidhof (DE); Andreas Löffler, Neutraubling (DE); Christoph Eichler, Donaustauf (DE); Bernhard Stojetz, Wiesent (DE); André Somers, Obertraubling (DE)

(73) Assignee: OSRAM OLED GMBH, Regensburg (DE)

( * ) Notice: Subject to any disclaimer, the term of this patent is extended or adjusted under 35 U.S.C. 154(b) by 0 days.

(21) Appl. No.: 16/452,015

(22) Filed: Jun. 25, 2019

(65) Prior Publication Data

US 2019/0319162 A1   Oct. 17, 2019

Related U.S. Application Data

(63) Continuation of application No. 15/594,519, filed on May 12, 2017, now Pat. No. 10,388,823.

(30) Foreign Application Priority Data

May 13, 2016   (DE) .................. 10 2016 108 891

(51) Int. Cl.
*H01L 33/00* (2010.01)
*H01L 21/687* (2006.01)
(Continued)

(52) U.S. Cl.
CPC .... *H01L 33/0025* (2013.01); *H01L 21/67115* (2013.01); *H01L 21/68764* (2013.01); *H01L 21/68771* (2013.01); *H01L 33/007* (2013.01); *H01L 33/0075* (2013.01); *H01L 33/0095* (2013.01); *H01L 33/26* (2013.01); *H01L 33/62* (2013.01); *H01S 5/1082* (2013.01); *H01S 5/222* (2013.01); *H01S 5/2219* (2013.01);
(Continued)

(58) Field of Classification Search
None
See application file for complete search history.

(56) References Cited

U.S. PATENT DOCUMENTS

| 4,654,090 A | 3/1987 | Burnham et al. |
| 4,855,255 A | 8/1989 | Goodhue |

(Continued)

FOREIGN PATENT DOCUMENTS

| CN | 1341275 A | 3/2002 |
| CN | 101044601 A | 9/2007 |

(Continued)

OTHER PUBLICATIONS

Notification of Reasons for Refusal dated Mar. 26, 2018 in Japanese Patent Application No. 2017-095646, and English translation thereof.

(Continued)

*Primary Examiner* — Bo B Jang
(74) *Attorney, Agent, or Firm* — MH2 Technology Law Group LLP

(57) ABSTRACT

A semiconductor chip (100) is provided, having a first semiconductor layer (1), which has a lateral variation of a material composition along at least one direction of extent. Additionally provided is a method for producing a semiconductor chip (100).

17 Claims, 14 Drawing Sheets

(51) Int. Cl.
*H01L 33/26* (2010.01)
*H01L 21/67* (2006.01)
*H01L 33/62* (2010.01)
*H01S 5/10* (2006.01)
*H01S 5/22* (2006.01)
*H01S 5/40* (2006.01)
*H01S 5/32* (2006.01)
*H01S 5/026* (2006.01)
*H01S 5/20* (2006.01)
*H01S 5/227* (2006.01)
*H01L 33/32* (2010.01)
*H01S 5/323* (2006.01)

(52) U.S. Cl.
CPC .......... *H01S 5/3205* (2013.01); *H01S 5/4031* (2013.01); *H01L 33/32* (2013.01); *H01S 5/026* (2013.01); *H01S 5/2036* (2013.01); *H01S 5/227* (2013.01); *H01S 5/32341* (2013.01); *H01S 2301/176* (2013.01); *H01S 2301/18* (2013.01)

(56) References Cited

U.S. PATENT DOCUMENTS

| | | | |
|---|---|---|---|
| 5,093,696 | A | 3/1992 | Kinoshita |
| 5,436,192 | A | 7/1995 | Epler et al. |
| 5,573,976 | A | 11/1996 | Kato et al. |
| 7,470,602 | B2 | 12/2008 | Kudo et al. |
| 9,728,673 | B2 | 8/2017 | Nataf et al. |
| 2002/0013114 | A1 | 1/2002 | Ohtani et al. |
| 2003/0148565 | A1 | 8/2003 | Yamanaka |
| 2005/0008351 | A1 | 1/2005 | Gat et al. |
| 2006/0228897 | A1 | 10/2006 | Timans |
| 2010/0034234 | A1 | 2/2010 | Hata et al. |
| 2010/0276710 | A1 | 11/2010 | Sampath et al. |
| 2012/0207180 | A1 | 8/2012 | Nam |
| 2014/0064314 | A1 | 3/2014 | Shur et al. |
| 2015/0323143 | A1 | 11/2015 | Raring et al. |
| 2016/0005918 | A1 | 1/2016 | Nataf et al. |
| 2017/0330996 | A1 | 11/2017 | Lell et al. |

FOREIGN PATENT DOCUMENTS

| | | | |
|---|---|---|---|
| CN | 101145518 | A | 3/2008 |
| CN | 102473607 | A | 5/2012 |
| CN | 105051917 | A | 11/2015 |
| EP | 0749154 | A2 | 12/1996 |
| EP | 2119683 | A1 | 11/2009 |
| JP | S5992522 | A | 5/1984 |
| JP | S62145888 | A | 9/1987 |
| JP | S63114287 | A | 5/1988 |
| JP | S63188940 | A | 8/1988 |
| JP | S63227089 | A | 9/1988 |
| JP | S63311787 | A | 12/1988 |
| JP | H03119760 | A | 5/1991 |
| JP | H03297187 | A | 12/1991 |
| JP | H04211117 | A | 8/1992 |
| JP | H05-190977 | A | 7/1993 |
| JP | H05190977 | A | 7/1993 |
| JP | H05343801 | A | 12/1993 |
| JP | H06124901 | A | 5/1994 |
| JP | H07221027 | A | 8/1995 |
| JP | H08148757 | A | 6/1996 |
| JP | H09008402 | A | 1/1997 |
| JP | H09283858 | A | 10/1997 |
| JP | H11097371 | A | 4/1999 |
| JP | H11330548 | A | 11/1999 |
| JP | 2000031595 | A | 1/2000 |
| JP | 2000100728 | A | 4/2000 |
| JP | 2001085742 | A | 3/2001 |
| JP | 2001261500 | A | 9/2001 |
| JP | 2003-008143 | A | 1/2003 |
| JP | 2003008143 | A | 1/2003 |
| JP | 200386890 | A | 3/2003 |
| JP | 2003303993 | A | 10/2003 |
| JP | 2004079867 | A | 3/2004 |
| JP | 2004288723 | A | 10/2004 |
| JP | 2008189492 | A | 8/2008 |
| JP | 2009166115 | A | 7/2009 |
| JP | 2010092952 | A | 4/2010 |
| JP | 2011077341 | A | 4/2011 |
| JP | 2011210885 | A | 10/2011 |
| JP | 2012059963 | A | 3/2012 |
| JP | 2013254894 | A | 12/2013 |
| JP | 2016508668 | A | 3/2016 |
| JP | 2017208544 | A | 11/2017 |
| JP | 6463405 | B2 | 1/2019 |
| KR | 10-2011-0011775 | A | 8/2017 |
| WO | 2013023197 | A2 | 2/2013 |

OTHER PUBLICATIONS

Notification of Reasons for Refusal dated May 7, 2018 in Japanese Patent Application No. 2017-095649, and English translation thereof.
Notice of Reasons for Refusal dated Sep. 10, 2018 in Japanese Patent Application No. 2017-095646, and English translation thereof.
First Office Action dated Dec. 26, 2018 in Chinese Patent Application No. 20170339986.9, and English translation thereof.
First Office Action dated Dec. 26, 2018 in Chinese Patent Application No. 201710339975.0, and English translation thereof.
First Office Action dated Dec. 28, 2018 in Chinese Patent Application No. 201710339165.5, and English translation thereof.
Final Notification of Reasons for Refusal dated Feb. 4, 2019 in Japanese Patent Application No. 2017-095643, and English translation thereof.
Decision on Rejection dated Jan. 15, 2020 in Chinese Patent Application No. 201710339986.9.
Notification of Reasons of Refusal dated Nov. 25, 2019 in Japanese Patent Application No. 2018-245135.
Decision of Refusal dated Sep. 10, 2019 in Japanese Patent Application No. 2017-095643.
Decision to Grant dated Oct. 23, 2019 in Japanese Patent Application No. 2017-95646.
Decision of Refusal dated Jun. 3, 2019 in Japanese Patent Application No. 2017-095646.
English translation of JP201092952, total pp. 14.
Second Office Action dated Aug. 2, 2019 in Chinese Patent Application No. 201710339986.9.
Second Office Action dated Aug. 20, 2019 in Chinese Patent Application No. 201710339975.0.
Second Office Action dated Aug. 22, 2019 in Chinese Patent Application No. 201710339165.5.
Japanese Decision to Grant, Japanese Application No. 2017-95643, dated Feb. 25, 2020, pp. 1-7 (including machine generated English translation).

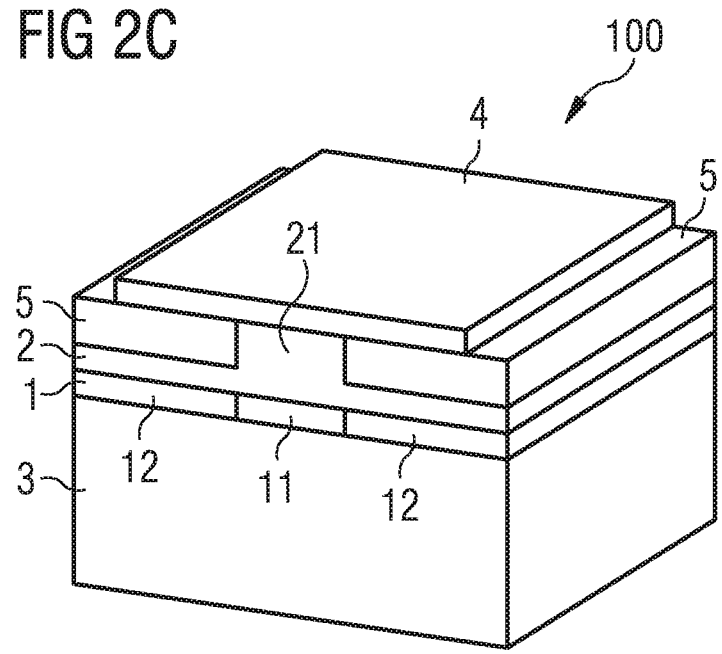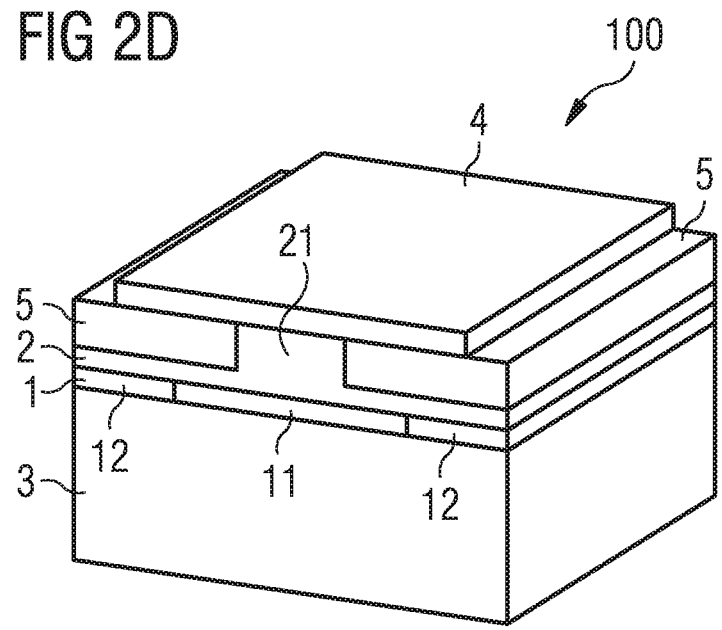

SEMICONDUCTOR CHIP AND METHOD FOR PRODUCING A SEMICONDUCTOR CHIP

RELATED APPLICATIONS

The present application is a continuation of, and claims the benefit of and priority to, U.S. patent application Ser. No. 15/594,519, filed May 12, 2017, which claims priority to German patent application No. 10 2016 108 891.9, the entire disclosures of both of which are hereby incorporated by reference.

DESCRIPTION

A semiconductor chip, and a method for producing a semiconductor chip, are provided. In particular, the semiconductor chip may be embodied as an optoelectronic semiconductor chip such as, for instance, a light-emitting semiconductor chip, for example a light-emitting diode chip or laser diode chip, or a light-detecting semiconductor chip.

Laser diodes are increasingly being used in new fields instead of light-emitting diodes, for example for lighting and production applications, in which their advantages with respect to a greater luminance and depth of field as compared with light-emitting diodes can be demonstrated. As compared with competitor technologies based on light-emitting diodes, however, in the use of laser diodes it may be disadvantageous that laser diodes exhibit laser emission only above a particular, often comparatively very high, current value, the laser threshold, and that, owing to the high luminance, laser facets are susceptible to facet damage that may result in spontaneous failure.

Owing to the high starting current of laser diodes, i.e. the height of the laser threshold, laser diodes are at a disadvantage in comparison with light-emitting diodes, particularly in the area of low currents and efficiency. A possibility for lowering the laser threshold is, for example, a greater reflectivity of the facet coating on the coupling-out facet, which, however, can at the same time reduce the steepness of the laser-diode characteristic and which, in turn, can thus have negative effects on the efficiency of the laser diode. A further possibility may consist in reducing the resonator geometry, for example the resonator length and width, but this correspondingly limits the achievable optical power of the laser diode. Alternatively, intensification of the index guiding and a reduced current spread may be achieved by creating a high waveguide structure, referred to as a ridge waveguide. In this case, however, it may be disadvantageous that the etching process used to produce the waveguide structure goes close to or through the active zone, which may result in damage, and consequently in problems with the component stability.

In order to increase the facet load limit, the resonator geometry may be enlarged, but this has the negative effect of a raised laser threshold. As an alternative to this, in various material systems there are efforts and approaches to make the region of the laser facet as absorption-free as possible. For example, it may be attempted, by means of implantation or diffusion, to achieve a mixing of the quantum film structure close to the facet, thereby enabling the energy gap, i.e. the band gap, to be increased accordingly. In this case, however, it may be disadvantageous that the dopants required for this may be incorporated on interstices, which may result in additional absorption centers that may negatively affect the component efficiency. Consequently, particularly in the case of implanted layers, it must be attempted, in a subsequent tempering step, to incorporate the dopants on lattice sites. However, the temperature required for this may result in damage to the quantum film structure, and consequently in losses in the laser threshold and in the steepness of the characteristic. Moreover, in the case of the high temperatures of diffusion and of the implantation tempering step, there may be a disintegration of the contact layer as a result of release of volatile components such as, for example, group V components, i.e. As, P or N, of the III-V semiconductor, which may result in increased operating voltages of the laser diode.

Alternative technological approaches are based on the principle of depositing on the laser facet, created by breaking, a crystalline or semi-crystalline layer that, with the least possible defects and distortion, can increase the energy gap of the semiconductor material. Possible methods for this are, for example, coatings by means of MBE (molecular beam epitaxy) or IBD (ion beam deposition). A disadvantage of this approach is the high degree of complexity, particularly in the handling of laser bars, which increases the production costs accordingly. Moreover, a uniform coating, over the entire laser facet, with a material that has an increased energy gap results in additional distortions on the facet, which may negatively affect the component stability.

At least one object of particular embodiments is to provide a semiconductor chip. At least one object of further embodiments is to provide a method for producing a semiconductor chip.

These objects are achieved by a subject-matter and a method according to the independent claims. Advantageous embodiments and developments of the subject-matter and the method are characterized in the dependent claims, and are also disclosed by the following description and the drawings.

According to at least one embodiment, a semiconductor chip has at least one first semiconductor layer. The first semiconductor layer may be, in particular, part of a semiconductor layer sequence that has a plurality of semiconductor layers.

According to at least one further embodiment, in the case of a method for producing a semiconductor chip, at least one first semiconductor layer is grown-on. The first semiconductor layer may be, in particular, part of a semiconductor layer sequence.

The embodiments described above and in the following relate equally to the method for producing the semiconductor chip and to the semiconductor chip.

The semiconductor chip may be realized, for example, as an optoelectronic semiconductor chip, i.e. as a light-emitting or light-detecting semiconductor chip, for instance as a light-emitting diode chip, laser diode chip or photodiode chip. Furthermore, as an alternative or in addition to an optoelectronic functionality, the semiconductor chip may also have an electronic functionality and be realized, for example, as a transistor or other electronic power element. Even if the description that follows relates mainly to optoelectronic semiconductor chips, and in this case particularly to light-emitting semiconductor chips, the embodiments of the semiconductor chip, and of the method for producing the semiconductor chip, that are described in the following also apply to other semiconductor chips, in particular also those of a non-optoelectronic design.

The semiconductor layer sequence may be realized, in particular, as an epitaxial layer sequence, i.e. as an epitaxially grown semiconductor layer sequence. The semiconductor layer sequence in this case may be realized, for example, on the basis of InAlGaN. InAlGaN-based semiconductor layer sequences include, in particular, those in which the epitaxially produced semiconductor layer sequence normally has a layer sequence of differing individual layers, which includes at least one individual layer having a material from the III-V compound semiconductor material system $In_xAl_yGa_{1-x-y}N$, with $0 \leq x \leq 1$, $0 \leq y \leq 1$ and $x+y \leq 1$. In particular, the first semiconductor layer may be based on such a material. Semiconductor layer sequences that have at least one InAlGaN-based active layer as part of a light-emitting semiconductor chip may preferably, for example, emit electromagnetic radiation in an ultraviolet to green wavelength range.

Alternatively or additionally, the semiconductor layer sequence may also be based on InAlGaP, i.e. the semiconductor layer sequence may have differing individual layers, of which at least one individual layer, for example the first semiconductor layer, has a material from the III-V compound semiconductor material system $In_xAl_yGa_{1-x-y}P$, with $0 \leq x \leq 1$, $0 \leq y \leq 1$ and $x+y \leq 1$. Semiconductor layer sequences that have at least one InAlGaP-based active layer as part of a light-emitting semiconductor chip may preferably, for example, emit electromagnetic radiation having one or more spectral components in a green to red wavelength range.

Alternatively or additionally, the semiconductor layer sequence may also have other III-V compound semiconductor material systems, for example an InAlGaAs-based material, or II-VI compound semiconductor material systems. In particular, an active layer of a light-emitting semiconductor chip that has an InAlGaAs-based material may be suitable for emitting electromagnetic radiation having one or more spectral components in a red to infrared wavelength range.

A II-VI compound semiconductor material system may have at least one element from the second main group, such as, for example, Be, Mg, Ca, Sr, and one element from the sixth main group, such as, for example, O, S, Se. In particular, a II-VI compound semiconductor material comprises a binary, ternary or quaternary compound that comprises at least one element from the second main group and at least one element from the sixth main group. Such a binary, ternary or quaternary compound may additionally have, for example, one or more dopants and additional constituents. For example, the II/VI compound semiconductor materials include: ZnO, ZnMgO, CdS, ZnCdS, MgBeO.

The first semiconductor layer and, in particular, the semiconductor layer sequence having the first semiconductor layer may be grown on a substrate that, here and in the following, may also be referred to as a growth substrate. The substrate in this case may comprise a semiconductor material, for example a compound semiconductor material system mentioned above, or another material, that allows epitaxial deposition. In particular, the substrate may comprise sapphire, GaAs, GaP, GaN, InP, SiC, Si and/or Ge, or be of such a material.

The semiconductor layer sequence of a semiconductor chip embodied as an optoelectronic semiconductor chip may have, as an active layer, for example, a conventional pn junction, a double heterostructure, a single-quantum well structure (SQW structure) or a multi-quantum well structure (MQW structure) for the purpose of light generation or light detection. The semiconductor layer sequence may comprise, in addition to the active layer, further functional layers and functional regions, for instance p- or n-doped charge-carrier transport layers, i.e. electron or hole transport layers, non-doped or p- or n-doped confinement, cladding or waveguide layers, barrier layers, planarizing layers, buffer layers, protective layers and/or electrodes, and combinations thereof. In particular, the first semiconductor layer may be at least part of a waveguide layer and/or of an active layer, or be such a layer. Moreover, the first semiconductor layer may also be part of another functional layer of the semiconductor layer sequence, or be such a layer. For example, the first semiconductor layer may be composed of one layer. Moreover, it is also possible for the first semiconductor layer to have a plurality of layers, or to be composed of a plurality of layers.

Furthermore, additional layers, for instance buffer layers, barrier layers and/or protective layers, may also be arranged perpendicularly in relation to the direction of growth of the semiconductor layer sequence, for example around the semiconductor layer sequence, i.e., for instance, on the side faces of the semiconductor layer sequence.

The first semiconductor layer and, in particular, a semiconductor layer sequence having the first semiconductor layer may be grown on a growth substrate by means of an epitaxial method, for example by means of metalorganic vapor phase epitaxy (MOVPE) or molecular beam epitaxy (MBE), and additionally provided with electrical contacts. The production of the first semiconductor layer and, in particular, of a semiconductor layer sequence having the first semiconductor layer, described in detail in the following, in this case may particularly preferably be effected in a wafer composite that, following the growth process, can be singulated by being divided into a plurality of semiconductor chips.

According to a further embodiment, during the growth process for growing the first semiconductor layer, an inhomogeneous lateral temperature distribution is created along at least one direction of extent of the growing first semiconductor layer. Here and in the following "lateral" denotes a direction that is oriented perpendicularly, or substantially perpendicularly, in relation to a direction of growth of the first semiconductor layer and, in particular, of the semiconductor layer sequence having the first semiconductor layer. The direction of growth in this case corresponds to the direction of arrangement of the individual layers of the semiconductor layer sequence that are arranged on one another. In particular, the first semiconductor layer, and furthermore also the other layers of the semiconductor layer sequence, may have an extent in the lateral direction that is greater than a thickness of the corresponding layers in the direction of growth. Accordingly, the first semiconductor layer, and furthermore also the other layers of the semiconductor layer sequence, may extend along directions of extent in differing lateral directions over the growth substrate.

In the case of the method described here, the inhomogeneous lateral temperature distribution along at least one direction of extent of the growing first semiconductor layer causes and produces a lateral variation of a material composition of the first semiconductor layer. The lateral variation of the material composition in this case is effected within the same material system. A variation of the material composition may mean a gradient of a proportion of one or more constituents of the first semiconductor layer along the at least one direction of extent. In simple terms, the proportion of at least one constituent increases or decreases because of a temperature-dependent incorporation of the constituents of the material composition of the first semiconductor layer. The first semiconductor layer therefore has at least two regions, laterally adjacent to each other, which are based on the same material system and which have differing material compositions. The transition of the material composition, i.e. the gradient of a proportion of one or more constituents of the first semiconductor layer, from a first of these regions to a second of these regions, may be abrupt, i.e. insofar as technically possible, stepped, or also continuous. Particularly preferably the layer thickness of the first semiconductor layer can be constant. In other words the at least two regions, which are laterally adjacent to each other and which have different material compositions, can have a same thickness. A "same" or "constant" thickness can mean in particular that the thickness of the first semiconductor layer varies, independent from a varying material composition, about not more than 10% or not more than 5% or, particularly preferably, not more than 1%.

The difference in the material composition, and consequently the difference in the proportion, of one or more constituents of the first semiconductor layer in the at least two laterally adjacent regions may be such, in respect of a respective proportion, averaged in the regions, of the one or more constituents, that a first region has a proportion of one or more constituents of the material composition of, for example, less than or equal to 99%, or less than or equal to 97%, or less than or equal to 95%, or less than or equal to 90%, or less than or equal to 85%, or less than or equal to 80%, or less than or equal to 75%, or less than or equal to 50%, or less than or equal to 25%, in comparison with a second region, or vice versa. The proportion of the constituents of the material composition in this case may preferably be specified in relation to the chemical summation formula.

For example, in the case of an InAlGaN material system, the incorporation of one or more semiconductor crystal constituents, in particular of indium, can be varied in the manner described by an inhomogeneous lateral temperature distribution in the lateral direction. Thus, a first semiconductor layer based on the InAlGaN material system may have a first region having the composition $In_xAl_yGa_{1-x-y}N$, and a second region having the composition $In_aAl_bGa_{1-a-b}N$, wherein it may be the case that x≤0.99a or x≤0.97a or x≤0.95a or x≤0.90a or x≤0.85a or x≤0.80a or x≤0.75a or x≤0.50a or x≤0.25a. Alternatively or additionally, the Al component and/or the Ga component may also vary correspondingly in the manner described. The composition in the regions may be, in particular, a composition averaged over the respective region. Likewise, in the case of other semiconductor material systems such as, for instance, InAlGaP or InAlGaAs, the incorporation of one or more constituents, i.e. for example the proportion of In and/or the proportion of Ga and/or the proportion of Al, can be varied by the inhomogeneous lateral temperature distribution.

In particular, the inhomogeneous lateral temperature distribution is present over at least one region on the growth substrate that corresponds to a future semiconductor chip. This means, in other words, that the first semiconductor layer is grown in a region on the growth substrate that corresponds to a semiconductor chip, and along at least one direction of extent has an inhomogeneous material composition that is created by the inhomogeneous lateral distribution during the growth process. Accordingly, the inhomogeneous lateral temperature distribution may recur periodically over the growth substrate, along the at least one direction of extent, according to the sequence of regions on the growth substrate that correspond to a plurality of semiconductor chips, such that a multiplicity of semiconductor chips, having the same, or at least substantially the same, lateral variations of the material composition of the first semiconductor layer, can be produced on-wafer. In the case of the method described here, therefore, an inhomogeneous lateral temperature distribution is selectively created during the growth process for growing the first semiconductor layer, such that a selective lateral variation of the material composition of the first semiconductor layer can be created.

The inhomogeneous lateral temperature distribution may effect a first temperature range and a second temperature range, which have a temperature difference of greater than or equal to 1 K, or greater than or equal to 2 K, or greater than or equal to 5 K, or even greater than or equal to 10 K. The transition from the first to the second temperature range may be abrupt, i.e. insofar as technically possible, substantially stepped, or continuous, according to a desired temperature profile. In the case of conventional wafer-based epitaxial processes, there may be unwanted temperature differences over the entire wafer, resulting in differing properties of semiconductor chips singulated from the wafer. In this case, there may be temperature differences of some kelvins between regions of the wafer that are at a distance from one another, of which, however, the order of magnitude and distance is far larger than the semiconductor chips to be produced. In the case of conventional growth methods, by contrast, the temperature distribution over a distance that corresponds to a chip extent is substantially homogeneous, such that, in the case of conventional methods, the semiconductor layers of the semiconductor chip are grown with homogeneous material compositions in the lateral direction, at least over an order of magnitude that corresponds to the chip size. In contrast to this, in the case of the method described here, an inhomogeneous lateral temperature distribution is selectively created on a length scale that is in the order of magnitude of the chip dimensions, in order to create an associated inhomogeneous material composition in at least the first semiconductor layer within the semiconductor chip. Unlike the conventional epitaxial processes, in the case of the method described here a temperature difference is thus produced on a length scale that corresponds to an extent of the semiconductor chip, or less, such that an inhomogeneous material composition is created, within a semiconductor chip, in at least the first semiconductor layer.

Differing local material compositions of the first semiconductor layer can result in laterally varying band gaps, absorption coefficients and/or refractive indices in the material of the first semiconductor layer. In the case of an active semiconductor layer that is intended for light generation, a laterally varying composition can thus also result in the generation of laterally varying wavelengths of the light emitted when the semiconductor chip is in operation. Unlike the method described here, in the case of known epitaxial deposition methods it is attempted, rather, to balance out previously described temperature variations and inhomogeneities, in order to obtain, insofar as possible, over the entire surface, a temperature distribution that is as uniform as possible, such that, insofar as possible, the material compositions of the growing layers do not vary in the lateral direction, in order to minimize from one semiconductor chip to another the described variations of the absorption coefficient, refractive index and/or wavelength of the light generated during operation.

According to a further embodiment, the semiconductor chip is embodied as a light-emitting semiconductor chip, in particular in the form of a semiconductor laser diode. The method described here makes it possible to effect selective local variation of the growth temperature on the growth substrate during the production of the first semiconductor layer, which may be, in particular, a waveguide layer and/or an active layer, or a part thereof. For example, in the case of an InAlGaN material system, the incorporation of one or more semiconductor crystal constituents, in particular indium, may be varied by an inhomogeneous lateral temperature distribution in the lateral direction. As a result, for instance in the region of the laser strip, i.e. in the region of the semiconductor chip in which the light generation is to occur, a greater incorporation of indium into the active layer or into a waveguide layer can be achieved than in adjoining regions. Since a reduction of the indium content in InAlGaN results, inter alia, in a reduction of the refractive index, in this way it is possible to create, in the lateral direction, a refractive index gradient in the first semiconductor layer by which it is possible to achieve an index guiding that, already after the growth process, is "incorporated" in the first semiconductor layer, and consequently in the semiconductor layer sequence having the first semiconductor layer.

According to a further embodiment, the semiconductor chip is embodied as a laser diode chip, and has a facet via which light is radiated when the semiconductor chip is in operation. The index guiding already incorporated in the semiconductor chip makes it possible to produce an index-guided laser diode even without producing a ridge waveguide, such that there is no need for a corresponding ridge etching. Consequently, chip production can be simplified and made less expensive. For example, in the case of broad stripe lasers, a higher band gap, created by the lateral variation of the material composition of the first semiconductor layer, makes it possible to reduce the current spread and absorption next to a laser strip, thereby enabling the laser performance to be improved.

According to a further embodiment, at least one second semiconductor layer, in which a ridge waveguide is created, is grown over the first semiconductor layer. A combination of the lateral variation of the material composition in the first semiconductor layer and, over the latter, a ridge waveguide structure in the second semiconductor layer makes it possible to achieve a very strong index guiding, which would not be possible by means of a ridge waveguide alone. It is thus possible, for example in the case of high-power laser diodes, to reduce the laser threshold and improve the efficiency. Furthermore, in comparison with usual diodes having ridge waveguides, it is possible to reduce the etching depth of the ridge waveguide structure, but still with a reduced current spread and improved index guiding, such that, for example, it is possible to avoid the risk that damage, caused by the etching process, in particular in the case of etching close to the active layer, will result in unwanted component ageing. Furthermore, it is possible to avoid the risk of leakage currents via the active layer as a result of surface recombinations, which can occur in the case of etchings through the active layer. Accordingly, the method described here makes it possible for the depth of the ridge etching, and consequently the height of the ridge waveguide structure, to be reduced significantly in comparison with conventional components, or to dispense entirely with a corresponding waveguide structure, since both the current limitation and the index guiding can be "incorporated" in the semiconductor layer sequence in the growth process.

Particularly preferably, in the case of a semiconductor chip embodied as a laser diode chip, a lateral variation of the material composition in the first semiconductor layer, on both sides of a laser strip, which may also be referred to as a laser ridge and which may be defined by a corresponding contact region or, additionally, a corresponding ridge waveguide structure, may be produced in such a manner that the energy gap in the material of the first semiconductor layer in increased on both sides of the laser ridge. In the material system InAlGaN, this may preferably be created by a reduction of the In content on both sides of the laser ridge, particularly in a first semiconductor layer embodied as an active layer, the reduction already being effected during the epitaxial growth process, in the manner described, by the creation of an inhomogeneous lateral temperature distribution. As a result, on the one hand, an unwanted current spread can be minimized, and on the other hand the absorption can be reduced and, at the same time, in the manner described previously, the index guiding can be improved. As an alternative to this, it may also be advantageous if the energy gap in the material of the first semiconductor layer is reduced on both sides of the laser strip, and the absorption is thus increased on both sides of the laser strip. This may be particularly preferred in the case of a broad stripe laser having a plurality of mutually adjacent laser strips, such that the laser strips are separated from each other by regions having a higher absorption. It is thereby possible to prevent, or at least reduce, a propagation of ring modes or a crosstalk between adjacent laser strips.

Furthermore, in the case of a semiconductor chip embodied as a laser diode chip, a lateral variation of the material composition in the first semiconductor layer may be produced in a facet region, i.e. a region of the first semiconductor layer that adjoins a facet, in such a manner that the energy gap is increased in a second region embodied as a facet region, in comparison with a first region of the first semiconductor layer that, as viewed from the facet, is more distant from the latter than the second region. In other words, the second region may be arranged such that it adjoins the facet and is between the facet and the first region, and may have a greater band gap than the first region. In the material system InAlGaN, the increase in the energy gap may preferably be created by a reduction of the In content in the facet region, particularly in a first semiconductor layer embodied as an active layer, the reduction being effected already during the epitaxial growth process, in the manner described, by creation of an inhomogeneous lateral temperature distribution. The absorption of the active layer in the facet region can thereby be reduced, or even prevented, and an increase in the facet load limit can thus be achieved.

Moreover, a differing material composition of the first semiconductor layer, in the case of a light-emitting semiconductor chip, i.e. a laser diode chip or a light-emitting diode chip, in particular if the first semiconductor layer forms at least a part of an active layer of the semiconductor chip that is intended for light generation, may result in differing emission wavelengths, such that it becomes possible for the semiconductor chip having the first semiconductor layer to radiate light of different wavelengths when different regions are in operation. The inhomogeneous lateral temperature distribution during the growth of the first semiconductor layer can thus result in a lateral wavelength distribution of the light emission in the subsequent operation of the semiconductor chip.

Furthermore, in the case of a semiconductor chip embodied as a light-emitting diode chip, a lateral variation of the material composition can be produced in the first semiconductor layer, beneath a contact layer embodied, at least partly, as a bond pad, in such a manner that the energy gap in the material of the first semiconductor layer beneath the bond pad is increased. In the material system InAlGaN, this may preferably be achieved by a reduction of the In content in the first semiconductor layer, which may preferably be embodied as an active layer, beneath the bond pad. This may be, in particular, a non-energized region of the first semiconductor layer. Absorption in such a non-energized region of the active layer can thereby be reduced, or even prevented. Moreover, the contact layer may have, in addition to a bond pad, current-carrying ridges for current distribution.

Beneath the current-carrying ridges, the material composition of the first semiconductor layer may be varied accordingly.

Furthermore, in the case of a semiconductor chip embodied as a light-emitting diode chip, the material composition in a first semiconductor layer, preferably embodied as an active layer, may be varied toward a lateral periphery of the semiconductor chip, such that the band edge of the quantum wells, and thus consequently the energy gap, of the first semiconductor layer is increased toward the periphery. In particular, in this case the first semiconductor layer may have a second region, which encloses a first region in the lateral direction, and which uninterruptedly adjoins the periphery of the semiconductor chip, and which has a correspondingly different material composition in comparison with the first region. As a result of the energy gap being increased at the periphery, leakage currents at the edge of the semiconductor chip formed by the periphery can be reduced, thereby enabling the performance and the ageing stability of the semiconductor chip to be increased.

According to a further embodiment, the inhomogeneous lateral temperature distribution is selectively created, during the growing of the first semiconductor layer, by local thermal influencing of predefined and specifically selected regions. In particular, the inhomogeneous lateral temperature distribution may be created, at least partly, by a temperature distribution structure and/or by a locally varying light irradiation. The measures described here for creating the inhomogeneous lateral temperature distribution are used, in particular, in addition to the commonly used, locally non-controllable epitaxial heating systems.

The locally varying light irradiation may comprise, for example, irradiation with a laser that radiates light onto the growing first semiconductor layer, in predefined and selectively selected regions, which light, as a result of absorption in the growing first semiconductor layer, or in a layer underneath it such as, for example, an already grown layer and/or a growth substrate, results in a local and inhomogeneous heating in these regions, such that, for the growing first semiconductor layer, differing effective growth temperatures prevail in differing regions. The light irradiation thus has, in particular, at least one spectral component that can be absorbed in the first semiconductor layer and/or in a layer or structure arranged beneath it in the direction of growth, such as, for instance, the temperature distribution structure. The locally varying light irradiation may be realized, in particular, such that one or more regions, the areal extents of which are smaller than those of the semiconductor chip, can be irradiated simultaneously or in succession on the growth substrate.

Furthermore, the light irradiation may be effected in a pulsed manner. Pulsed irradiation, particularly in combination with a moving, for example rotating, growth substrate, may be used to irradiate predefined, separate regions, which move through under the light beam. Furthermore, light may be selectively deflected onto predefined regions by a light deflecting means, for example from or by means of a mirror. These measures make it possible to scan the surface on which the first semiconductor layer is grown. It is possible in this case that an individual light beam, in particular a single laser beam, is used. Alternatively or additionally, it is possible to use a plurality of light sources that can be operated synchronously or independently of one another, in particular a plurality of laser light sources that can be operated synchronously or independently of one another, to generate a locally varying light irradiation, which light sources, according on their operation, being able, for example, to illuminate and thereby locally heat a plurality of regions.

The described local heating, based on light irradiation, for controlling the temperature distribution may furthermore be coupled to the in-situ measuring instruments that are usually present in the growth reactor, i.e. temperature measuring instruments and/or measuring instruments for measuring the wafer curvature, such that, for each growth substrate, the light power radiated onto the growth substrate can be locally adapted, for example on the basis of the instantaneous curvature data based on a curvature measurement and/or on the basis of a spatially resolved temperature measurement, such that, in a first step, the temperature profile can be homogenized during the growing phase, in particular each phase of growth. The homogenization in this case can balance out temperature differences on the growth substrate, as well as between a plurality of growth substrates provided simultaneously in the reactor for coating. In a second step, a modulation can be selectively applied to the homogenized temperature profile, such that the desired lateral inhomogeneous temperature distribution can be created on the growth substrate, thereby making it possible to effect the desired regions of the first semiconductor layer having differing material compositions. The second step may additionally be further improved in that special markings, in the form of adjustment or trigger markings, are applied to the growth substrate, in particular before the procedure. These markings can be detected during the growing process, in the course of the light irradiation, such that the temperature profile can be adjusted to these markings. This makes it possible, in the further course of the production process, for the regions having the different material compositions, and consequently the different wavelength ranges, to be accurately assigned to the chip structures.

The temperature distribution structure may have at least one temperature distribution structure element, which effects a local increase or reduction of the temperature of the growing first semiconductor layer. The temperature distribution structure element may have, at least along one direction of extent, a lateral extent that is less than a lateral extent of the semiconductor chip, such that the local temperature change can be effected in a sub-region of the semiconductor chip. In particular, the temperature distribution structure may have a plurality of temperature distribution structure elements, which are arranged regularly and/or periodically in the lateral direction, according to the intended inhomogeneous lateral temperature distribution profile. The temperature distribution structure element or elements may be embodied, for example, in the form of mutually separate islands and/or line structures.

The temperature distribution structure mentioned in the following description may represent one temperature distribution structure element or a plurality of temperature distribution structure elements. In particular, the following embodiments and feature relating to the temperature distribution structure may be combined with one another, such that there may be temperature distribution structure elements that differ from one another and that, in combination, can effect the desired temperature distribution.

According to the desired temperature-changing effect of the temperature distribution structure, the latter may have, or be composed of, a dielectric material, semiconducting material, metal, or a plurality thereof or combination therewith. Dielectric materials can effect, for example, local influencing of the thermal conductivity and thereby, as a result of an improved or reduced delivery or removal of heat, a local raising or lowering of the temperature in the growing first semiconductor layer. Semiconducting and metallic materials can likewise influence the thermal conductivity and/or be selectively heated by irradiation by light or other suitable electromagnetic radiation such as, for example, microwave radiation. The electromagnetic radiation may be radiated, for example, uniformly and over a large area, or in a locally varying manner.

The temperature distribution structure may have, or be composed of, for example, a material that differs from the growth substrate. Furthermore, it is also possible for the temperature distribution structure to have a material that is the same as the growth substrate. In particular, in this case, the temperature distribution structure and the growth substrate may be formed in one piece.

According to one embodiment, the temperature distribution structure is arranged on a side of the growth substrate that faces away from the first semiconductor layer. In other words, the growth substrate has a rear side, on which the temperature distribution structure is arranged, and a front side, on which the first semiconductor layer is grown. Alternatively or additionally, it is also possible for the temperature distribution structure to be arranged on a side of the growth substrate that faces toward the semiconductor layer. In this case, the temperature distribution structure may be arranged beneath the growing first semiconductor layer, in the direction of growth, and thus between the growth substrate and the first semiconductor layer. Alternatively or additionally, it may furthermore be possible for the temperature distribution structure to be embedded in the growth substrate and/or in a semiconductor layer on the growth substrate.

It may be particularly advantageous if the temperature distribution structure is arranged in direct contact with the growth substrate. This may mean, in particular, that the temperature distribution structure is arranged in an embedded manner directly on the rear side and/or the front side of the growth substrate or, also, in the growth substrate.

According to a further embodiment, the temperature distribution structure is covered, at least partly, by a protective layer. This may mean that the temperature distribution structure, as viewed from the growth substrate, is covered by a protective layer, and/or that there is a protective layer arranged between the temperature distribution structure and the growth substrate. If the temperature distribution structure is covered on all sides by a protective layer, then, in particular, it may be embedded in the protective layer. The protective layer may be provided and embodied, in particular, such that the growth process during the growing of the first semiconductor layer, and in particular the semiconductor layer sequence having the first semiconductor layer, are not negatively influenced by the temperature distribution structure. For example, outgassing or vaporization of material of the temperature distribution structure can be prevented by the protective layer.

According to a further embodiment, the temperature distribution structure and/or the protective layer remain, at least partly, or also entirely, in the completed semiconductor chip. This may be the case, for example, if the temperature distribution structure is arranged on the side of the growth substrate that faces toward the first semiconductor layer, or is embedded in the growth substrate, and the growth substrate remains, at least partly, in the semiconductor chip. Furthermore, it is also possible for the temperature distribution structure to be arranged on the rear side of the growth substrate that faces away from the first semiconductor layer, and for the growth substrate, together with the temperature distribution structure, to remain in the semiconductor chip. As an alternative to this, it may also be the case that the temperature distribution structure does not remain, or remains only partly, in the semiconductor chip, and is removed, at least partly, or completely, before completion of the semiconductor chip. For example, an at least partial or complete removal of the temperature distribution structure may be effected in the course of an at least partial removal, i.e. thinning, or complete removal of the growth substrate.

According to a further embodiment, the temperature distribution structure is embodied for selective local heating of regions of the growing first semiconductor layer. In this case, the one temperature distribution structure element or the plurality of temperature distribution structure elements may be embodied as heating elements. For example, a temperature distribution structure element embodied as a heating element may have a material, in particular a semiconductor or a metal, that absorbs electromagnetic radiation. Furthermore, the one temperature distribution structure element or the plurality of temperature distribution structure elements may be embodied as temperature conducting elements, which are more able than a laterally adjacent material, i.e. for example the growth substrate or a semiconductor layer, to conduct a heat, provided by a carrier that carries the growth substrate, to the growing first semiconductor layer.

According to a further embodiment, the temperature distribution structure is embodied for selective local reduction of the temperature of regions of the growing first semiconductor layer. In this case, the one temperature distribution structure element or the plurality of temperature distribution structure elements may be embodied as thermal barrier elements, which are less able than a laterally adjacent material, i.e. for example the growth substrate or a semiconductor layer, to conduct a heat, provided by a carrier that carries the growth substrate, to the growing first semiconductor layer.

According to a further embodiment, a temperature distribution structure element or a plurality of temperature distribution structure elements each have an elevation and/or a recess in the growth substrate. Alternatively, the one temperature distribution structure element or the plurality of temperature distribution structure elements may be applied to the growth substrate and, together with the latter, each form an elevation and/or recess. For example, a temperature distribution structure element may have a recess, in or on the growth substrate, arranged in which there is a thermal barrier material having a lesser thermal conductivity than the growth substrate. Alternatively or additionally, it is also possible for a temperature distribution structure element to have or form an elevation in the growth substrate. Such topographically embodied temperature distribution structure elements may be used, for example, to effect a selectively locally varying thermal coupling to a carrier, on which the growth substrate is arranged.

According to a further embodiment, the protective layer has a dielectric material. For example, the protective layer may be formed by an oxide and/or nitride and/or oxynitride with a metal and/or a metalloid, for example silicon oxide, titanium oxide, aluminum nitride and/or aluminum oxide. In order to achieve an optimal protective effect, it may be advantageous if the protective layer is applied by a method that allows formation of a layer that is as sealed as possible. An atomic layer deposition method, for example, may be advantageous for this purpose.

Further advantages, advantageous embodiments and developments are given by the exemplary embodiments described in the following in conjunction with the figures.

BRIEF DESCRIPTION OF THE FIGURES

FIGS. 2A to 2J are schematic representations of semiconductor chips according to further exemplary embodiments.

DETAILED DESCRIPTION

In the exemplary embodiments and figures, elements that are the same, of the same type or have the same effect are in each case denoted by the same references. The elements represented and their relative size ratios are not to be regarded as true to scale, but instead the size of individual elements such as, for example, layers, components, devices and regions may be exaggerated to aid illustration and/or to aid comprehension.

Figure 1:
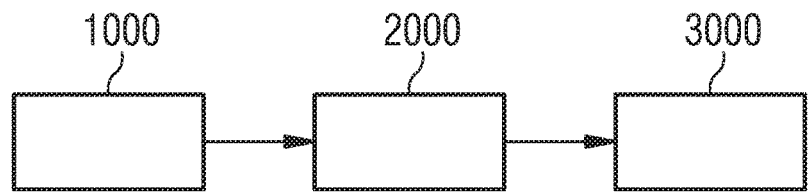
FIG. 1 is a schematic representation of a method for producing a semiconductor chip according to the exemplary embodiment.

Shown in FIG. 1 is a method for producing a semiconductor chip according to one exemplary embodiment, in which the semiconductor chip is produced with a first semiconductor layer having a lateral variation of the material composition. For this purpose, in a first method step 1000, a surface is provided, on which the first semiconductor layer is grown. The first semiconductor layer may preferably be part of a semiconductor layer sequence, which, in addition to the first semiconductor layer, has a plurality of further semiconductor layers. The surface provided for growing the first semiconductor layer may be formed by a growth substrate, or a semiconductor layer that is grown on the growth substrate and that may also be part of an already grown sub-layer stack of the semiconductor layer sequence.

In a further method step 2000, the first semiconductor layer sequence is grown on the provided surface. This may also mean that, before growing of the first semiconductor layer, one or more further semiconductor layers of the semiconductor layer sequence may be grown on the surface. During the growth process for growing the first semiconductor layer, an inhomogeneous lateral temperature distribution is created along at least one direction of extent of the growing first semiconductor layer. The inhomogeneous lateral temperature distribution during the growth process causes a lateral variation of the material composition of the first semiconductor layer. This means, in other words, that the material that is provided and supplied for growing the first semiconductor layer is deposited, in the course of the growth process, on at least two or more surface regions of the provided surface, which have differing temperatures. The composition of the growing material is dependent on the local temperature of the respective surface region, such that the differing temperatures in the at least two or more surface regions result in differing material compositions. Accordingly, the first semiconductor layer has at least two or more regions of differing material compositions, which are arranged laterally next to each other along at least one direction of extent of the first semiconductor layer. The temperature differences between the surface regions of the provided surface many be greater than or equal to 1 K, or greater than or equal to 2 K, or greater than or equal to 5 K, or even greater than or equal to 10 K. Between two adjacent surface regions having differing temperatures, the surface temperature may change abruptly, i.e. insofar as technically possible, substantially in a stepped manner, or continuously, having a desired temperature profile.

In a further method step 3000, following the growing of the first semiconductor layer having the lateral variation of the material composition, the semiconductor chip is completed. This may mean, for example, that, inter alia, one or more further semiconductor layers of the semiconductor layer sequence and/or one or more passivation layers and/or one or more contact layers are applied. Alternatively or additionally, other process steps such as, for example, etching processes and other structuring processes, as well as singulation steps for singulating a wafer composite into individual semiconductor chips, are performed.

Further features of the method for producing the semiconductor chip, and further features of the semiconductor chip thus produced, are described in the following figures. The exemplary embodiments described in the following, however, are not to be understood such that they limit the possible method features, and the features of the semiconductor chip produced by the method, only to the features specifically described in the following. Rather, the following exemplary embodiments are to be understood as purely exemplary for possible method features and for features of the semiconductor chips that can be produced by the method.

Exemplary embodiments for semiconductor chips 100 are described in conjunction with FIGS. 2A to 5C. The semiconductor chips 100 may be produced, in particular, by a method according to the exemplary embodiment of FIG. 1, i.e. a method in which, during a growth process for growing a first semiconductor layer 1, an inhomogeneous lateral temperature distribution is created along at least one direction of extent of the growing first semiconductor layer 1, such that a lateral variation of a material composition of the first semiconductor layer 1 is produced. The semiconductor chips 100 shown thus have a first semiconductor layer 1 that, along at least one direction of extent, has a lateral variation of a material composition resulting from a laterally varying temperature distribution during a growth process.

In the exemplary embodiments shown, the first semiconductor layer 1 is, purely exemplarily, part of a semiconductor layer sequence that, in addition to the first semiconductor layer 1, has, for example, a second semiconductor layer 2 and a third layer 3, between which the first semiconductor layer 1 is arranged. Each of the layers 1, 2, 3 of the semiconductor layer sequence may have one or more layers, or be composed thereof. The layers of the semiconductor layer sequence are arranged on one another along a direction of growth. The direction of growth may also be referred to as the vertical direction. Perpendicularly to the direction of growth, the layers of the semiconductor layer sequence have an extent along directions of extent in the lateral direction, the lateral extent preferably being greater than the thickness of the layers in the vertical direction. The semiconductor layer sequence can be grown, in particular, in the wafer composite, which can subsequently be singulated into a multiplicity of semiconductor chips 100.

For example, the third layer 3 may have a substrate, which may be electrically conductive or electrically insulating, and on which the further layers of the semiconductor layer sequence are applied. The substrate may be a growth substrate, described in the general part above, on which the semiconductor layers of the semiconductor layer sequence are grown by means of an epitaxial growth method such as, for example, MOVPE or MBE. As an alternative to this, the substrate may be a so-called carrier substrate, onto which the semiconductor layers of the semiconductor layer sequence are transferred after having been grown on a growth substrate. Following the growing process, the growth substrate may be thinned or removed completely, such that can also be possible for the layer 3 in the finished semiconductor chip 100 to have no substrate.

In the exemplary embodiments of FIGS. 2A to 4E, the semiconductor chips 100 are embodied, purely exemplarily, as edge-emitting laser diode chips, having an active layer for generating light, in particular laser light. The first semiconductor layer 1 in this case may be formed, in particular, by at least a part of a waveguide layer and/or of the active layer. In other words, the first semiconductor layer 1 may be a part of a waveguide layer, and/or a part of an active layer, and/or be or have a waveguide layer, and/or be or have an active layer. Furthermore, the first semiconductor layer 1 may also be formed by a plurality of layers that together form a part of a waveguide layer, and/or at least a part of an active layer, and/or a waveguide layer, and/or an active layer.

In addition to having the first semiconductor layer 1, the semiconductor layer sequence of the semiconductor chip 100 may have further functional semiconductor chips such as, for example, one or more layers selected from waveguide layers, cladding layers, buffer layers and semiconductor contact layers, which may be part of the second semiconductor layer 2 and third layer 3, or which, singly or in combination, may form the second semiconductor layer 2 and the third layer 3 of the semiconductor layer sequence. Furthermore, the first semiconductor layer 1 may also have such a layer.

Applied on the semiconductor layer sequence there is contact layer 4, which has a bondable and/or solderable metal, for electrically contacting the semiconductor chip 100. The contact layer 4 may also have a corresponding layer sequence of a plurality of metal layers. The term "metal", apart from denoting a pure metal, may also denote mixtures, alloys and compounds having or composed of a plurality of metals that have properties suitable for electrical contacting and for electrical connection. Suitable metals for the contact layer 4 may be, singly or in combination, one or more selected from gold, aluminum, silver, titanium, platinum, nickel, palladium, rhodium and tungsten.

The semiconductor chip 100 have at least one further contact layer, which for reasons of clarity is not shown in the figures and which, together with the contact layer 4, enable electrical connection of the semiconductor chip 100 to be effected. For example, the third layer 3 may be electrically conductive, and the further contact layer is applied on a side of the third layer 3 that faces away from the first semiconductor layer 1. Alternatively, the further contact layer may be arranged on a correspondingly exposed part of the surface of the semiconductor chip 100, next to the contact layer 4 shown.

In at least some exemplary embodiments, the semiconductor chips 100 have, in regions, i.e. in sub-regions between the contact layer 4 and the semiconductor layer sequence, a passivation layer 5, which electrically insulates a part of the surface of the semiconductor layer sequence against the contact layer 4. The passivation layer 5 may be, or be composed of, for example, an electrically insulating oxide, nitride or oxynitride, or a combination of such materials. For example, the passivation layer may have one or more of the following materials: aluminum oxide, silicon oxide, silicon nitride, silicon oxynitride, titanium oxide. The passivation layer 5 makes it possible to provide a contact layer 4 having a large contact surface, which is large enough for external electrical contacting of the semiconductor chip 100, for example by means of a soldered connection or a bond wire, while the semiconductor layer sequence is electrically connected, in a smaller region, by the electrical contact layer 4. The contact region between the contact layer 4 and the semiconductor layer sequence may define, in particular, the region of the active layer in which it is sought to generate light, and may be embodied accordingly, for example in the form of a strip. In the case of laser diode chips, the strip-type contact region may preferably extend from a front side face of the semiconductor layer sequence, which forms a coupling-out facet for light emission, to an oppositely located, rear side face of the semiconductor layer sequence, which forms a reflective rear-side facet. Appropriate layers such as, for example, partially or fully reflective layers, and layer combinations, according to the required functionalities, may be applied on the facets.

Purely exemplarily, the first semiconductor layer 1, and preferably the semiconductor layer sequence of the semiconductor chip 100, are based on the III-V compound semiconductor material system InAlGaN, described above in the general part. Thus, in the exemplary embodiments shown, the material composition of the first semiconductor layer 1 in this case may vary in the lateral direction with respect to at least one of the crystal constituents of InAlGaN. Particularly preferably, the material composition varies with respect to the indium content, which is particularly dependent on the growth temperature. Thus, in the case of usual growth temperatures, the incorporated indium content may become less as the growth temperature increases, such that, in regions of the growing first semiconductor layer 1 in which there prevails a lesser growth temperature, in comparison with other regions, it is possible to effect a greater incorporation of indium and, consequently, a resultant greater indium content.

In dependence on the lateral variation of the material composition along at least one direction of extent, properties of the first semiconductor layer 1 may vary along this direction of extent. In the material system InAlGaN, for example, a higher indium content may result in a higher refractive index, a reduction of the band gap and an increase of the optical absorption. Correspondingly, a higher indium content may result in a reduction of the refractive index, an increase of the band gap and a reduction of the optical absorption.

Particularly preferably the layer thickness of the first semiconductor layer 1 is constant in the shown embodiments as depicted in the Figures. In particular, the thickness of the first semiconductor layer 1 can vary about not more than 10% or not more than 5% or, particularly preferably, not more than 1% independent from the material composition of different regions.

Figure 2A:
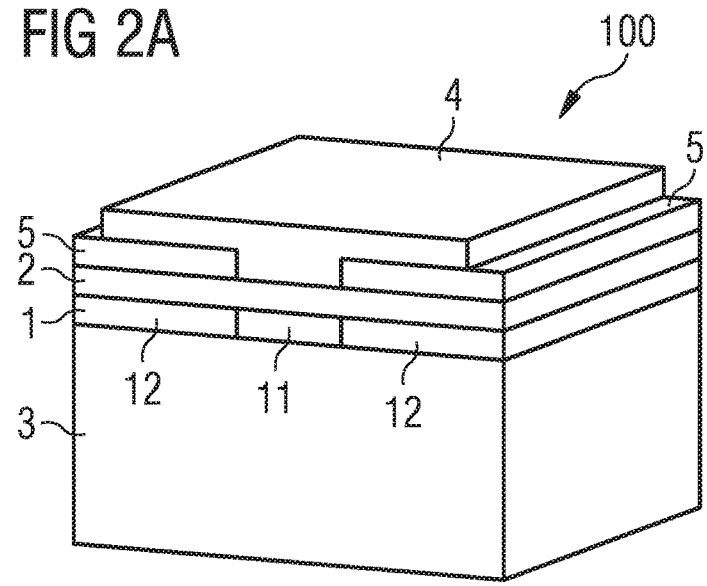

The semiconductor chip 100 shown in FIG. 2A is embodied as a so-called single-emitter oxide strip laser, and has a semiconductor layer 1, having regions 11, 12, arranged laterally next to each other, that have differing material compositions. The region 11 is embodied in the form of a strip, corresponding to the contact region, arranged above it, between the semiconductor layer sequence and the contact layer 4, and in the lateral direction, transversely in relation to the direction of extent of the strip, adjoins the regions 12. As viewed toward the coupling-out facet or the rear-side face of the semiconductor chip 100, the regions 12 are thus arranged on both sides, i.e. on the left and right, next to the region 11. The region 11, which, as viewed toward the coupling-out facet, may have a width in the range of from some micrometers up to some 10 μm, preferably forms the laser strip, which corresponds to the region provided for light generation. This means that the width of the region 11 preferably corresponds to the width of the laser strip, i.e. of the light-generating region, the latter being defined substantially by the width of the contact region of the contact layer 4 and the semiconductor layer sequence. The width of the region 11 may, however, also be greater or less than the width of the laser strip, for example by 50% or by 25% or by 10%, or also by values between the stated values.

The region 11 has a greater indium content than the laterally adjacent regions 12, such that the regions 12 have a lower refractive index and a greater band gap than the region 11. Owing to the lesser band gap, the region 11 forming the laser strip is thus a region having a greater corresponding wavelength than the adjacent regions 12 on both sides. The difference in the refractive index and in the band gap make it possible, when the semiconductor chip 100 is in operation, to achieve an index guiding of the light generated in the active layer, in the laser strip, that is already "incorporated" in the semiconductor chip 100 following the epitaxial growth. It is thereby possible for an index guiding to be achieved without a ridge waveguide structure, usual in the prior art, such that the etching process associated therewith is not necessary. In addition, absorption loses in the regions 12 are reduced by the band gap, which is increased in comparison with the region 11, and by the corresponding wavelength, reduced for this purpose, next to the laser strip. Moreover, the current spread in the active layer is reduced, particularly in the case of a quantum well. Both effects can positively affect the laser threshold and the steepness of the characteristic.

In the case of usual ridge waveguide structures, the etching depth must be kept precisely to a few nanometers, since an excessively flat etching can cause current spread, and consequently weak guidance, which may be reflected in impaired performance, lesser characteristic linearity and reduced yield, while an excessively deep etching may result in stability problems and non-linearities in the dependence of operating current on light output, so-called "kinks". Accordingly, the etching process for producing conventional ridge waveguide structures represents an elaborate production process. Furthermore, the forming of a metallic contact layer over the conventional ridge waveguide structure can be critical, and increase the risk of so-called erosion. Owing to the surface structure formed by a conventional ridge waveguide structure, there may furthermore be heating problems in the case of the laser diode chip being mounted with the ridge side downward.

As a result of the index guiding being incorporated into the first semiconductor layer 1, in the form of a planar structure, during the growth process, an improved yield, a better laser performance, an improved characteristic linearity and a greater component stability can be obtained for the thus produced semiconductor chip 100, with regard to the described problems of ridge etching. In addition, the production process can be simpler than in the case of a conventional laser diode having a ridge waveguide structure. Furthermore, the application of the contact layer 4, and consequently the forming of a metallic layer over the semiconductor layer sequence is simpler and less susceptible to error, which may be reflected in a greater stability. In addition, the planar structure, provided for index guiding, produced in the first semiconductor layer 1, which results in a correspondingly planar structure for the contact layer 4 also, can result in improved heating in the case of the semiconductor chip 100 being mounted with the contact layer 4 downward.

Figure 2B:
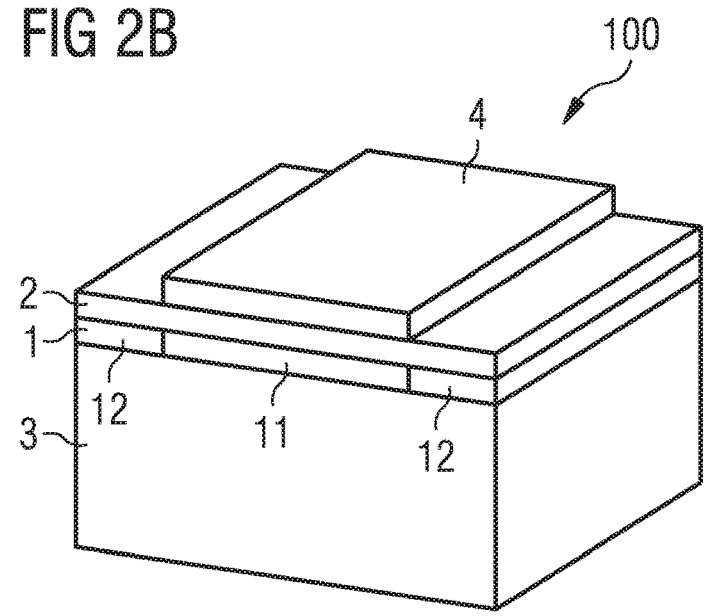

The semiconductor chip 100 shown in FIG. 2B is embodied as a so-called single-emitter broad stripe laser and, in comparison with the exemplary embodiment of FIG. 2A, has a wider region 11 having a higher indium content, as compared with the laterally adjoining regions 12 on the left and right. The wider region 11 corresponds substantially to the, in comparison with the exemplary embodiment of FIG. 2A, now likewise wider, active region, which forms the laser strip and is provided for light generation. Owing to the greater width of the region provided for light generation, a contact layer 4 that is also sufficiently wide for external contacting can be applied on the semiconductor layer sequence without a passivation layer 5 arranged in between. The semiconductor chip 100 shown in FIG. 2B is accordingly characterized by very simple processing and, at the same time, an improved laser performance, in comparison with the prior art, due to the integrated waveguiding already described in conjunction with FIG. 2A.

Figure 2E:
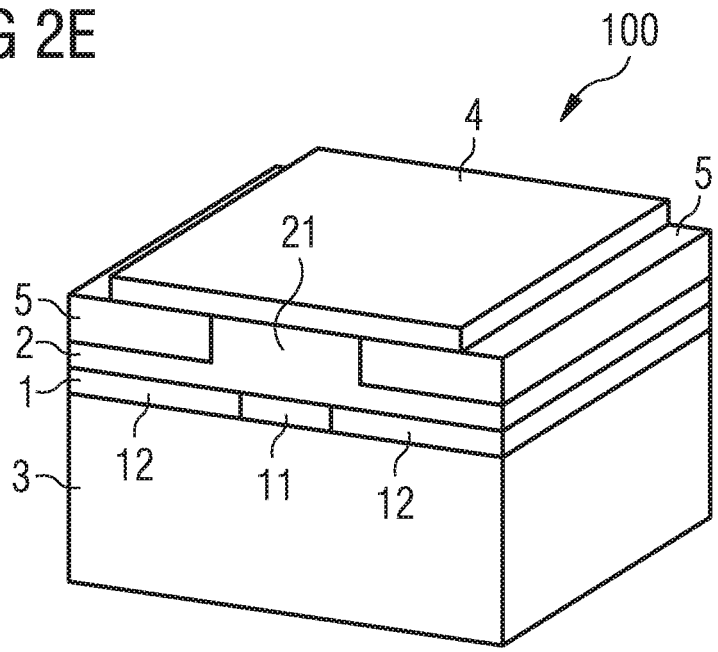

Shown in FIGS. 2C to 2E are semiconductor chips 100 that, in comparison with the previous exemplary embodiments, and in particular in comparison with the exemplary embodiment of FIG. 2A, have, over the first semiconductor layer 1, a second semiconductor layer 2, which, over the region 11 having the increased indium content, additionally have a ridge waveguide structure 21. This structure, in combination with the waveguiding already incorporated in the first semiconductor layer 1 by the described growth process, makes it possible to achieve an improved yield, a higher laser performance and improved far-field properties. In comparison with conventional laser diodes, which have only a ridge waveguide structure, in the case of the semiconductor chips 100 of the exemplary embodiments of FIGS. 2C to 2E, moreover, a lesser etching depth is required in the production of the ridge, which can result in a better ageing stability and lesser susceptibility to faults in the production process.

The width of the region 11 can be varied, in comparison with the width of the ridge waveguide structure 21, by differing extents of lateral variations of the growth temperature during the growth process for producing the first semiconductor layer 1, whereby differing component properties can be produced by one same production process. As shown in FIG. 2C, the region 11 and the ridge waveguide structure 21 may be of the same, or at least substantially the same, width. As shown in FIGS. 2D and 2E, the width of the region 11 may also be greater or less than the width of the ridge waveguide structure 21.

As described in connection with the exemplary embodiments of FIGS. 2A to 2E, it is possible either to dispense with a ridge waveguide structure, or the depth of the ridge etching can be reduced significantly, since both the current limiting and the index guiding can be incorporated in the semiconductor chip 100. Furthermore, it may be the case that, if necessary, the contact layer 4 must at most be partially removed, as shown in FIG. 2B.

Figure 2F:
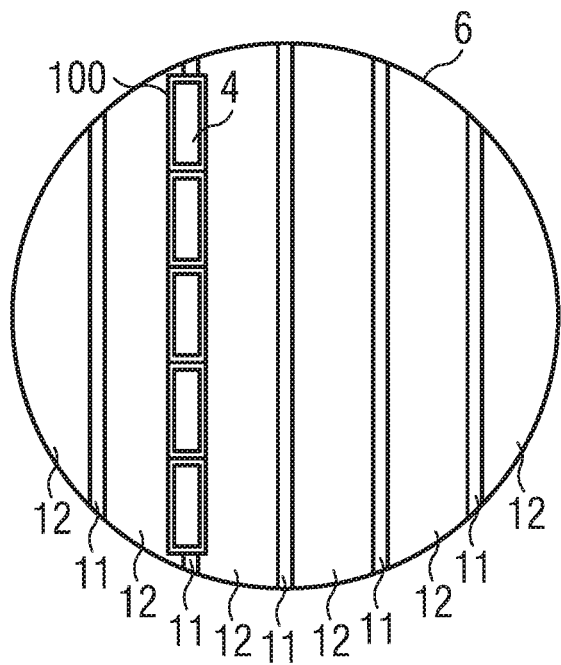

Indicated in FIG. 2F is a substrate 6, on the surface 61 of which the first semiconductor layer can be grown. The substrate 6 is embodied as a growth substrate in the form of a wafer, having a diameter of, for example, greater or equal to 2 inches, and less than or equal to 12 inches. In particular, the wafer may have a diameter of 2 inches, or 4 inches, or 6 inches, or 8 inches, or 12 inches. Such a substrate 6 can be used to produce a multiplicity of semiconductor chips, by application of the semiconductor layer sequence and the further layers of the semiconductor chip on-wafer, and subsequent singulation. The substrate 6 may be used in a conventional coating process, in which one substrate or a plurality of such substrates is or are arranged on a suitable substrate carrier in a coating chamber.

Figure 2G:
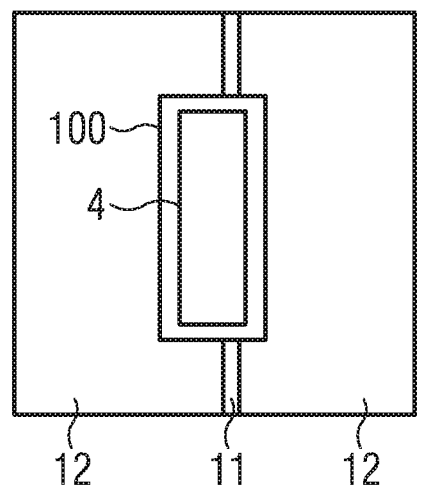

Indicated, purely exemplarily and not true to scale, on the substrate 6 are the positions of the previously described regions 11 and 12, and of some subsequently completed semiconductor chips 100. FIG. 2G shows a corresponding detail, with only one indicated semiconductor chip 100. The position of the contact layer 4 on the semiconductor chip 100 is likewise indicated. This, as shown in the previous figures, may be arranged symmetrically in relation to the first region 11, or also, as shown in FIGS. 2F and 2G, laterally offset in relation to the first region. The latter arrangement renders possible bonding of the contact layer 4 next to the laser strip. The numbers of the regions 11 and 12, and of the semiconductor chips 100, may differ from the numbers shown in FIG. 2F, depending on the size of the substrate and on the size of the semiconductor chips 100.

Figure 2H:
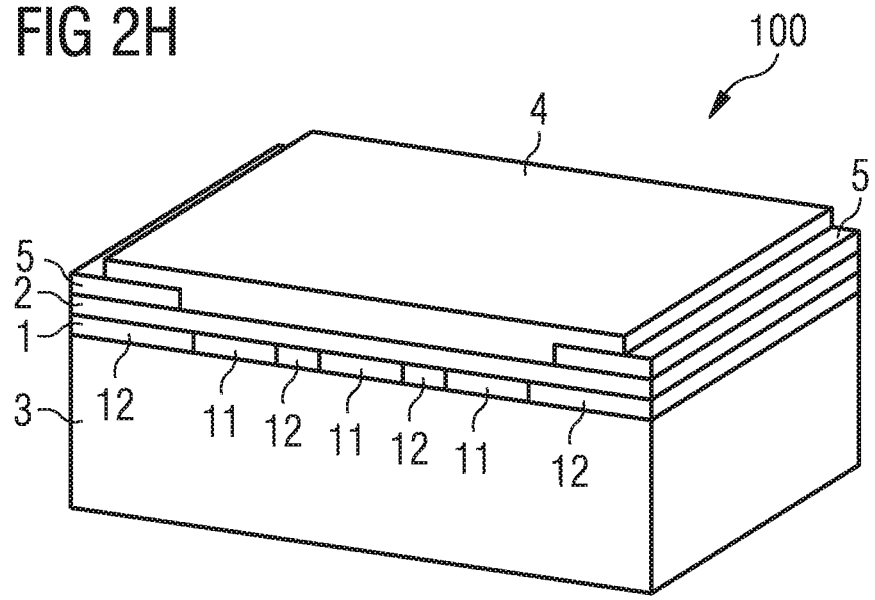
Figure 2I:
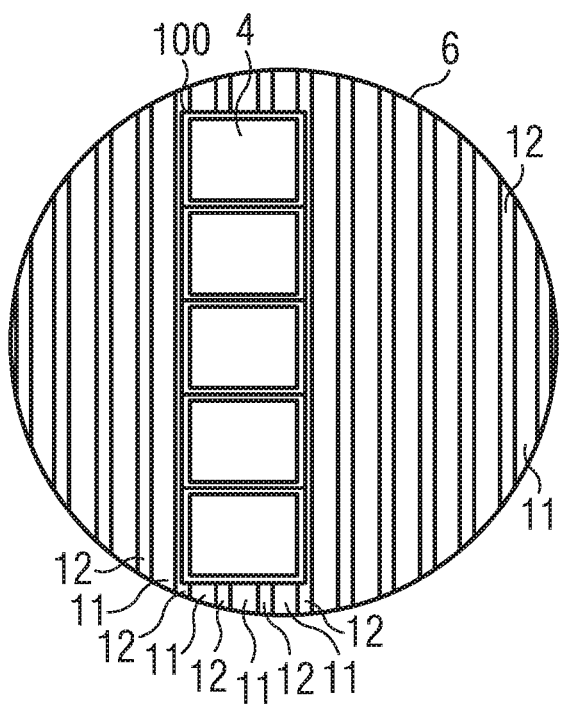
Figure 2J:
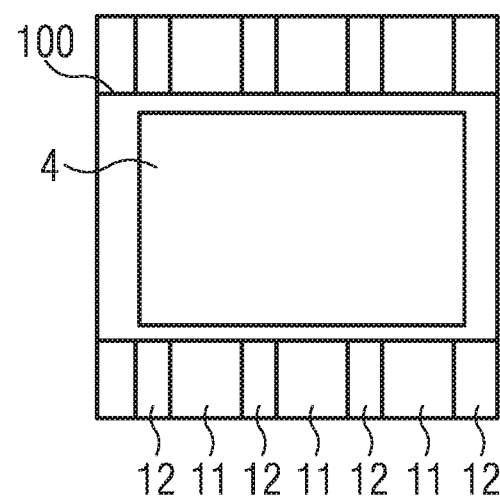

Shown in conjunction with FIGS. 2H to 2J are further exemplary embodiments of semiconductor chips 100 that, in comparison with the previous exemplary embodiments, form multi-emitting laser diode chips in the forms or laser bars or laser arrays.

FIG. 2H shows an exemplary embodiment for a semiconductor chip 100 that is embodied as a multi-emitting laser bar, having a first semiconductor layer 1, which has a plurality of strip-type regions 11, of lower indium content, which are arranged laterally next to each other, which correspond to a plurality of laser strips, and consequently to a plurality of regions for light generation, and which are separated from each other by regions 12 having a higher indium content. The contacting of the plurality of regions 11 is effected via a common contact layer 4. In the case of broad stripe lasers, in particular, it may be advantageous if the laser strips are located in regions 11 having a greater band gap, and consequently an accordingly reduced corresponding wavelength, which are separated from each other by regions 12 having a lesser band gap, and consequently an accordingly increased corresponding wavelength. The regions 12, which accordingly have an increased optical absorption, serve as optical absorbers, which can reduce or suppress propagation of ring modes and/or crosstalk of the laser strips to adjacent laser strips. This concept may also be applied correspondingly for single diodes, such as the semiconductor chips shown in the previous figures, and for laser arrays, in which laser strips may be operated either individually, in groups or jointly.

Shown in FIGS. 2I and 2J, and as described above in conjunction with FIGS. 2F and 2G, is a substrate 6, having positions and numbers of regions 11 and 12, which are not true to scale and which are purely exemplary, and semiconductor chips 100 according to the exemplary embodiment of FIG. 2H.

Figure 3:
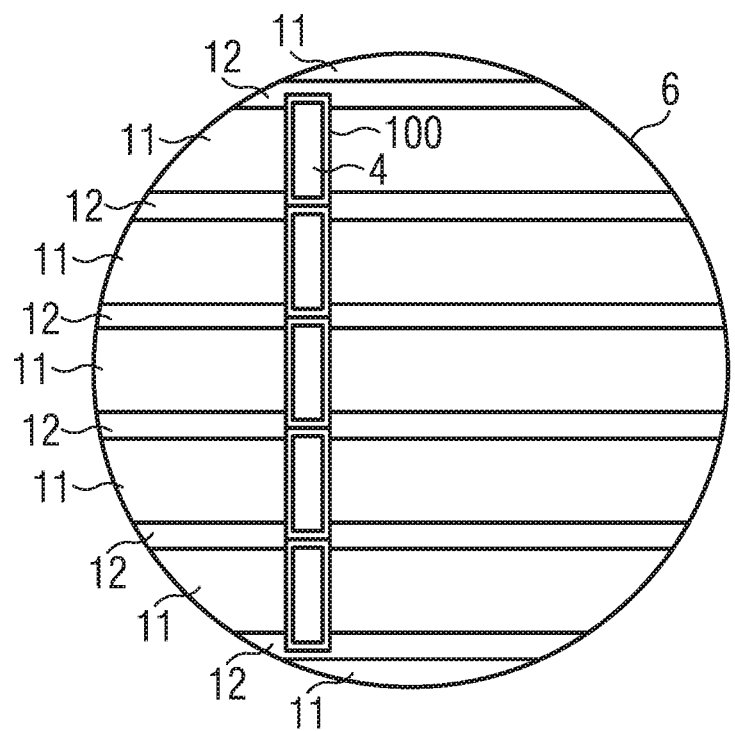
FIGS. 3 to 5C are schematic representations of semiconductor chips according to further exemplary embodiments.

A further exemplary embodiment is shown in FIG. 3. In particular, FIG. 3 again shows a substrate 6, having positions and numbers of regions 11 and 12, which are not true to scale and which are purely exemplary, and semiconductor chips 100. As an alternative to an arrangement of laterally adjacent regions 11, 12 of the first semiconductor layer having differing material compositions along the laser ridge, such regions may also be arranged transversely in relation to the laser ridge, as also indicated in FIG. 3.

The semiconductor chips 100 according to the exemplary embodiment of FIG. 3 have, in particular, a lateral variation of the material composition in the first semiconductor layer in a facet region, i.e. in a region of the first semiconductor layer that adjoins a facet. In other words, the semiconductor chips 100 to be produced on the substrate 6 are located, relative to the first semiconductor layer, primarily in first regions 11, while the facets of the semiconductor chips 100 are located in second regions 12 that, in comparison with the first regions 11, have a different material composition. In particular, in comparison with the first regions 11 of the first semiconductor layer, which, as viewed from the facets, are farther away from the facets than the second regions, the second regions 12, embodied as facet regions, have a greater energy gap, and consequently a lesser absorption.

In the material system InAlGaN, the energy gap increase in the second regions 12 may be produced, preferably, by a reduction of the In content, in particular in a first semiconductor layer embodied as an active layer. As a result, in the second regions, the first semiconductor layer has a wavelength, corresponding to the band gap, that is less than the corresponding wavelength in the first region 11. Although single-emitter laser diodes are indicated in FIG. 3, the shown lateral variation of the material composition of the first semiconductor layer may also be applied for multi-emitter laser diodes, such as laser bars or laser arrays.

Owing to the increase of the band gap in the facet regions, the facet load limit can be increased, such that the risk of catastrophic optical damage (COD) to the facets is reduced, since the absorption losses on the facets, and therefore the facet temperature during operation, can be reduced. Since this non-absorbing facet technology does not require additional dopants or subsequent temperature processes, no non-absorbing recombination centers are produced and the contact layer 4 is not negatively affected. Owing to the improved facet load limit, a greater optical output power can be achieved, by the supplying of a higher current. Designs having multi-emitter laser diodes as described, for example, in conjunction with FIGS. 2H to 2J, can accordingly be realized with fewer laser strips, which can be advantageous in terms of cost.

In connection with this, it may be particularly advantageous if, as is shown in FIG. 3, and also in the previous FIGS. 2F, 2G, 2I and 2J, the contact layer 4, other than is shown in the FIGS. 2A to 2E and 2H, does not extend quite as far as the facets, such that the semiconductor chips 100, when in operation, are not supplied with current in the facet regions. The COD stability can thereby be further increased.

FIGS. 4A to 4E show exemplary embodiments of semiconductor chips 100, in details corresponding to the representations in FIGS. 2G and 2J, during their production on substrates, which have combinations of the previously described lateral variations of the material composition of the first semiconductor layer. Furthermore, the semiconductor chips 100 described in conjunction with FIGS. 4A to 4E have, purely exemplarily, a ridge waveguide structure 21, as described in conjunction with FIGS. 2C to 2E. As an alternative to this, also possible in connection with the exemplary embodiments described in the following are exemplary embodiments that, like the exemplary embodiments in FIGS. 2A, 2B and 2H, do not have a ridge waveguide structure, and/or that have a plurality of laser strips.

Figure 4A:
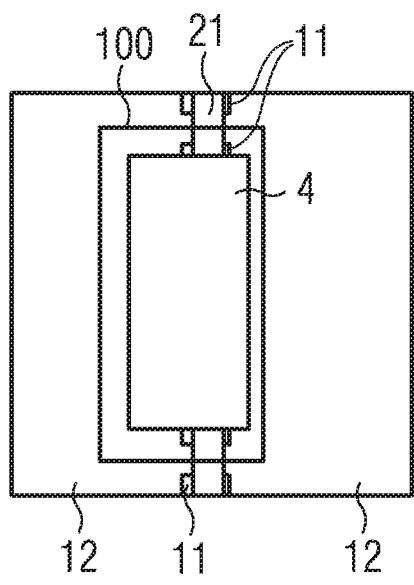

The exemplary embodiment of FIG. 4A has a combination of features described in conjunction with FIGS. 2C and 3, namely, an increased band gap, and consequently an accordingly reduced corresponding wavelength on both sides next to the laser ridge and in the facet region, owing to correspondingly embodied first and second regions 11, 12. In particular, the laser strip is located in the first region 11, which is broken through on the facets by the second region. Low absorption losses and a high level of COD protection can thereby be achieved.

Figure 4B:
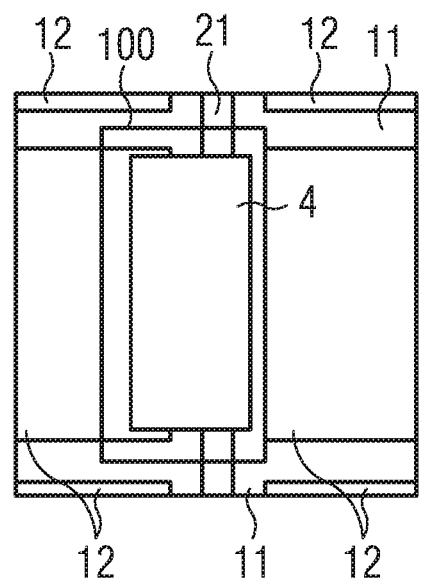

The exemplary embodiment of FIG. 4B has a combination of the features described in conjunction with the FIGS. 2B, 2H and 3, namely, an increased band gap, and consequently an accordingly reduced corresponding wavelength in the region of the laser ridge and in the facet region, and a reduced band gap, and consequently an accordingly increased corresponding wavelength and an increased absorption on both sides next to the laser ridge, owing to correspondingly embodied first and second regions 11, 12. It is thereby possible to prevent formation of ring modes and optical crosstalk, and to achieve a high level of COD protection.

Figure 4C:
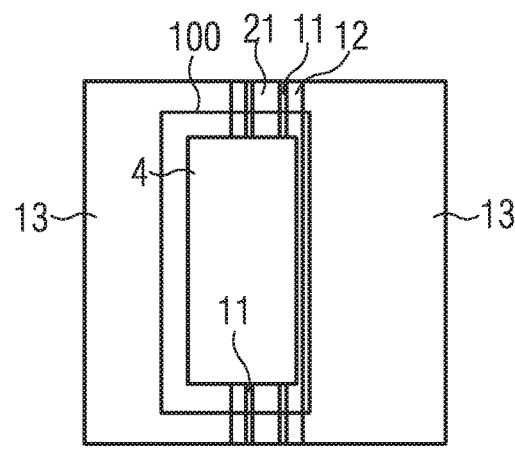

The exemplary embodiment of FIG. 4C has a combination of features described in conjunction with FIGS. 4A and 4B, namely, an increased band gap, and consequently an accordingly reduced corresponding wavelength on both sides next to the laser ridge, owing to correspondingly embodied first and second regions 11, 12, and a reduced band gap, and consequently an accordingly increased corresponding wavelength and an increased absorption on both sides next to the laser ridge, owing to additionally formed third regions 13 of the first semiconductor layer on both sides next to the second regions 12. The first and the third region 11 and 13 in this case may be formed so as to be the same or at least similar in respect of their material compositions. In addition, there may also be a lateral variation of the material composition of the first semiconductor layer in the facet region. The advantages mentioned previously in connection with FIGS. 4A and 4B can thereby be achieved. In particular, the combination of regions of the first semiconductor layer, shown in FIG. 4C, having differing laterally varying material compositions, can be characterized by low absorption losses and an improved radiation behavior, owing to a lesser proportion of scattered light.

Figure 4D:
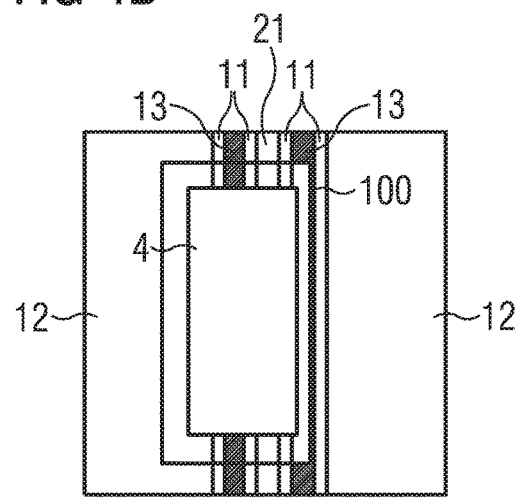

The exemplary embodiment of FIG. 4D, like the exemplary embodiment of FIG. 4B, has an increased band gap, and consequently an accordingly reduced corresponding wavelength in the region of the laser ridge, and a reduced band gap, and consequently an accordingly increased corresponding wavelength and an increased absorption on both sides next to the laser ridge, owing to correspondingly embodied first and second regions 11, 12. In addition, the first semiconductor layer has, on both sides of the laser ridge, within the first region 11, a third region 13, in which the material composition is selected, in comparison with the first and the second region 11, 12, such that the band gap is yet higher in comparison with the first and the second region 11, 12. Low absorption losses and an improved radiation behavior can thereby be achieved, owing to a lesser proportion of scattered light. The third region 13 may also be arranged, for example, only on one side of the laser ridge.

Figure 4E:
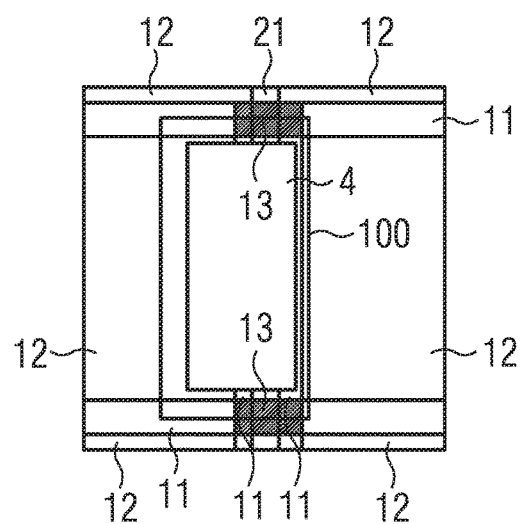

The exemplary embodiment of FIG. 4E is embodied like the exemplary embodiment of FIG. 4B, but additionally has, in the facet region, a respective third region 13, in which the material composition is selected, in comparison with the first and the second region 11, 12, such that the band gap is yet higher in comparison with the first and the second region 11, 12, whereby, in addition to the advantages described in conjunction with FIG. 4B, the absorption losses in the facet region can be reduced yet further.

Figure 5A:
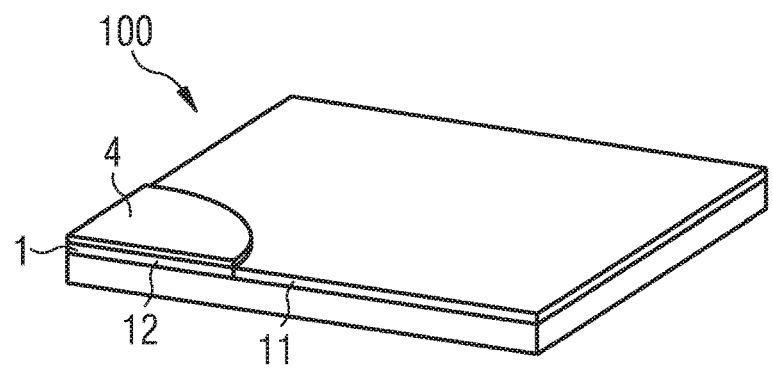
Figure 5B:
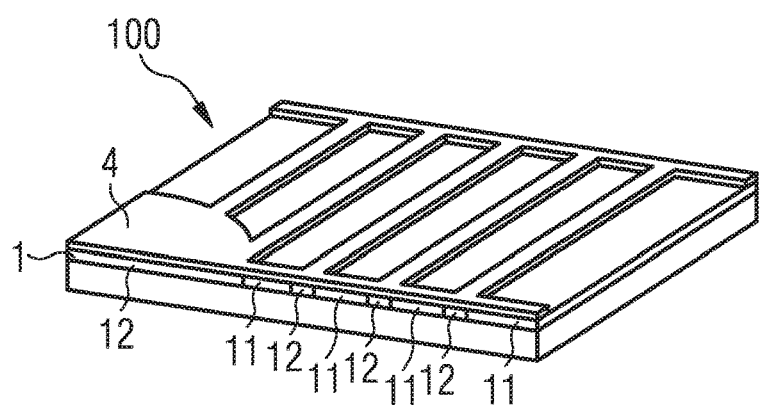
Figure 5C:
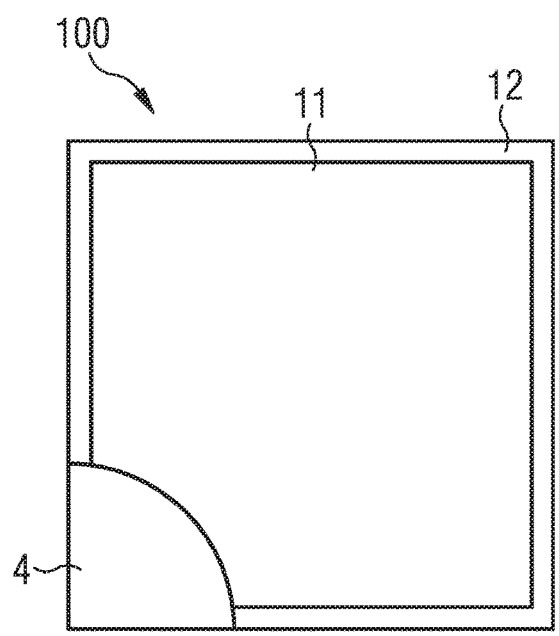

FIGS. 5A to 5C show exemplary embodiments for semiconductor chips 100 embodied as light-emitting diode chips. These chips have, on a semiconductor layer sequence having a first semiconductor layer 1, a contact layer 4 that is embodied, at least partly, as a bond pad, which, in the exemplary embodiment shown, is in a corner of the top side of the chip. Beneath the bond pad, the first semiconductor layer 1, which may preferably be an active layer, has a lateral variation of the material composition in the form of a first region and, laterally adjacent thereto, a second region 12. The lateral variation of the material composition is formed in such a manner that, in the second region 12 beneath the bond pad, in comparison with a first region 11, which corresponds to the region of the first semiconductor layer 1 that is not covered by the bond pad, the energy gap in the material of the first semiconductor layer 1 is increased. The second region 12 may be, in particular, a non-energized region of the first semiconductor layer 1, which is not intended for light generation. Absorption in the non-energized region of the first semiconductor layer 1 can thereby be reduced, or even prevented. For example, an electrically insulating layer, like the passivation layer described above in connection with the laser diodes, may be arranged between the bond pad and the semiconductor layer sequence.

In comparison with the exemplary embodiment of FIG. 5A, the contact layer 4 of the semiconductor chip 100 according to the exemplary embodiment of FIG. 5B also has current-carrying ridges for current distribution, in addition to the bond pad. Beneath the current-carrying ridges, the material composition of the first semiconductor layer 1 may be correspondingly varied in second regions 12, in comparison with the first regions 11, which correspond to the regions of the first semiconductor layer 1 that are not covered by the contact layer 4. Absorption losses beneath the current-carrying ridges can thereby be prevented.

In the exemplary embodiment of FIG. 5C, the material composition of the first semiconductor layer 1, which is preferably embodied as an active layer, is varied toward a lateral periphery of the semiconductor chip, such that the band edge of the quantum wells, and thus consequently the energy gap, of the first semiconductor layer 1 is increased toward the periphery. For this purpose, the first semiconductor layer 1 has a second region 12, which encloses a first region 11 in the lateral direction. The second region 12 uninterruptedly adjoins the periphery of the semiconductor chip 100, and has a material composition that is correspondingly different from that of the first region 11. As a result of the band gap being increased at the periphery, leakage currents at the edge of the semiconductor chip 100 formed by the periphery can be reduced, thereby enabling the performance and the ageing stability of the semiconductor chip 100 to be increased.

FIGS. 6A to 6D show exemplary characteristics of the band gap of differing regions of the first semiconductor layer, corresponding to the laterally varying material compositions. The characteristics shown may exist singly or in combination in the previously shown exemplary embodiments. The vertical axis corresponds to a characteristic along a direction of extent X of the first semiconductor layer in the lateral direction, while the vertical axis represents the band gap BG, and consequently the variation in the material composition.

Figure 6A:
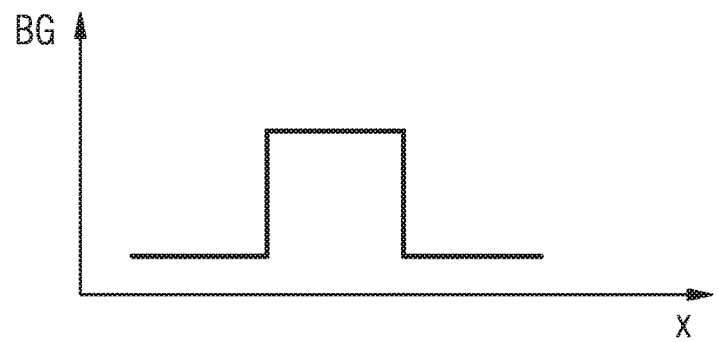
FIGS. 6A to 6D are schematic representation of variations of the material composition of the first semiconductor layer according to further exemplary embodiments.
Figure 6B:
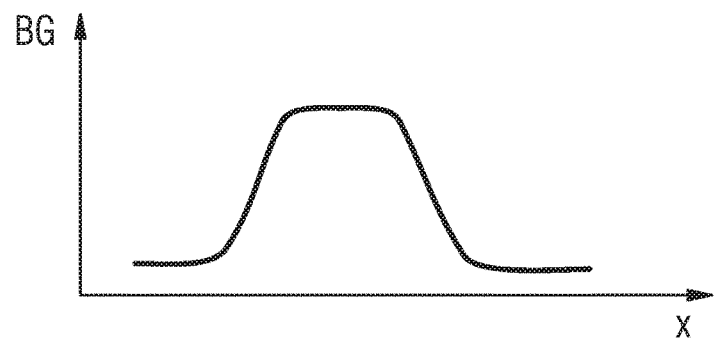
Figure 6C:
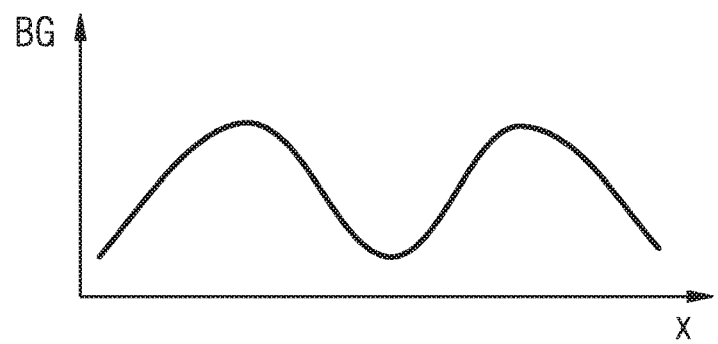
Figure 6D:
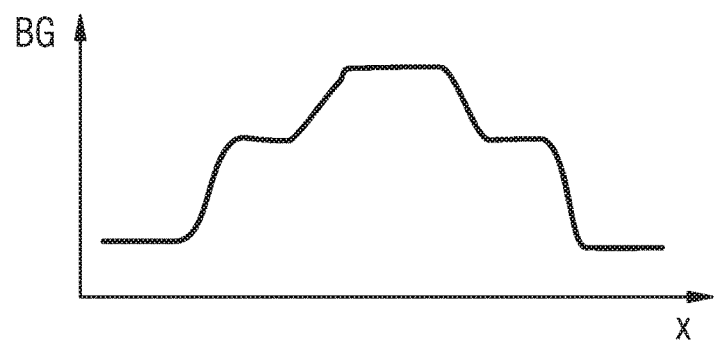

As shown in FIG. 6A, the transition between the regions of differing material composition may be sharply bounded, and in this case, for example, stepped. Furthermore, the transition may also be continuous, for example, in a ramped form, as shown in FIG. 6B. FIG. 6C shows a flowing transition, while FIG. 6D shows a multistage transition.

The variations in the band gap in the differing regions, besides being achieved by the varying material composition, may also be achieved, additionally or alternatively, by mixing of heterogeneous boundary surfaces, a so-called quantum well intermixing.

Possibilities for producing inhomogeneous lateral temperature distributions for growing the first semiconductor layer are described in conjunction with the following figures. The inhomogeneous lateral temperature distribution is selectively produced, during the growing of the first semiconductor layer, by local thermal influencing of predefined and specifically selected regions. In particular, the inhomogeneous lateral temperature distribution may be produced, at least partly, by a temperature distribution structure and/or by a locally varying light irradiation, as described in the following. If a temperature distribution structure is used, this can remain according to the arrangement in the semiconductor chip. Accordingly, the previously described semiconductor chips may additionally also have temperature distribution structures according to the following exemplary embodiments.

Represented in FIGS. 7A to 7D are exemplary embodiments for a substrate 6, on the surface 61 of which the first semiconductor layer can be grown. The substrate 6 is embodied as a growth substrate in the form of a wafer, having a diameter of, for example, greater or equal to 2 inches, and less than or equal to 12 inches. In particular, the wafer may have a diameter of 2 inches, or 4 inches, or 6 inches, or 8 inches, or 12 inches. Such a substrate 6 can be used to produce a multiplicity of semiconductor chips, by application of the semiconductor layer sequence and the further layers of the semiconductor chip on-wafer, and subsequent singulation. The substrate 6 may be used in a conventional coating process, in which one substrate or a plurality of such substrates is or are arranged on a suitable substrate carrier in a coating chamber.

Figure 7A:
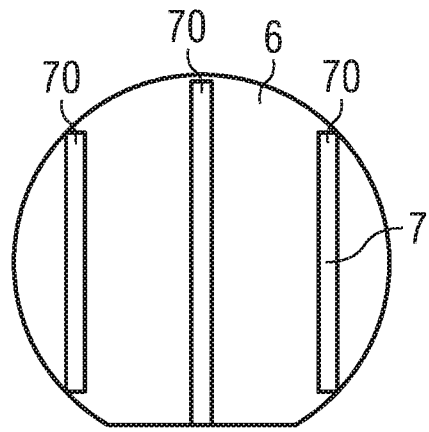
FIGS. 7A to 10F are schematic representations of features of methods for producing semiconductor chips according to further exemplary embodiments.
Figure 7B:
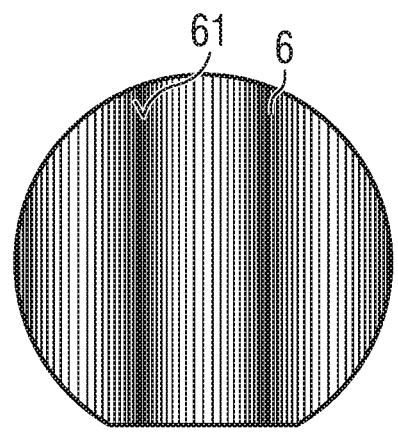
Figure 7C:
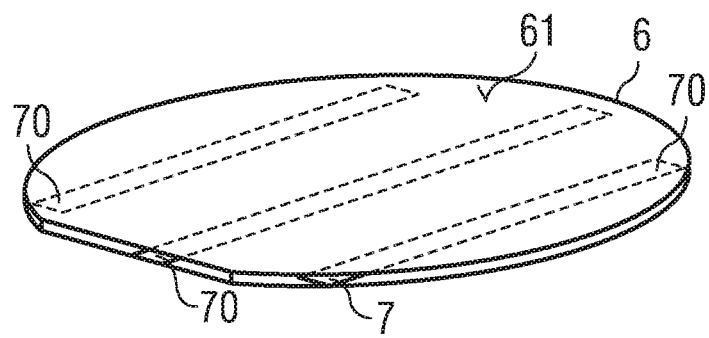

As can be seen, for example, in FIGS. 7A and 7C, the substrate 6 has a temperature distribution structure 7, which can selectively produce an inhomogeneous lateral temperature distribution along at least one direction of extent of the first semiconductor layer to be grown. The temperature distribution structure 7 has temperature distribution structure elements 70, which are suitable and provided for influencing the local temperature distribution on the surface 61 during the growth process. These may be heat conducting elements, heating elements and/or thermal barrier elements, as described at a later point in conjunction with FIGS. 8A to 8K. According to the desired temperature-changing effect of the temperature distribution structure 7, the latter may have, or be composed of, a dielectric material, a semiconducting material, a metal, or a plurality or combination of these materials. Dielectric materials can effect, for example, local influencing of the thermal conductivity and thereby, as a result of an improved or reduced conduction of heat, a local raising or lowering of the temperature on the surface 61, and consequently in the growing first semiconductor layer. Semiconducting and metallic materials can likewise influence the thermal conductivity and/or be selectively heated by irradiation by light or other suitable electromagnetic radiation such as, for example, microwave radiation, such that, in the region of the temperature distribution structure elements 70, more heat is produced, and consequently a higher temperature can be generated than in the adjacent regions. As described above, for example in the case of InAlGaN, the indium content of the first semiconductor layer, which is highly dependent on the growth temperature, can thereby be set and varied. Accordingly, properties of the first semiconductor layer such as, for example, the refractive index, the band gap and consequently, if appropriate, the emission wavelength and the absorption behavior, can be varied laterally.

In particular, the temperature distribution structure 7 has a plurality of temperature distribution structure elements 70, which are arranged regularly and/or periodically in the lateral direction, according to the intended inhomogeneous lateral temperature distribution profile. As shown, the temperature distribution structure elements may be embodied, for example, in the form of mutually separate islands and/or line structures.

In the exemplary embodiment shown, the temperature distribution structure elements 70 have, along the direction of their arrangement, i.e. in the exemplary embodiment shown, in the lateral direction perpendicular to the direction of main extent of the linear structures, a lateral extent that is less than a corresponding lateral extent of the semiconductor chips to be produced, such that the local temperature change of each of the temperature distribution structure elements 70 can be produced, respectively, in a sub-region of a future semiconductor chip. Temperature distribution structure elements 70 whose width along the direction of arrangement is less than corresponding dimensions of the semiconductor chips makes it possible to produce, for example, the regions of the first semiconductor layer that are described in conjunction with FIGS. 2A to 2H.

FIGS. 7A to 7D show, purely exemplarily, for reasons of clarity, only three strip-type temperature distribution structure elements 70, which are located on a rear side of the substrate 6 that faces away from the surface 61. The lateral inhomogeneous temperature distribution resulting therefrom, which, in the case of InAlGaN, also corresponds to the indium distribution on the substrate 6, is indicated in FIG. 7B. Depending on the size of the substrate 6 and the size of the semiconductor chips to be produced, which, for example in the case of laser diode chips, may have lateral dimensions of less than 100 µm up to some 100 µm for single-emitter chips, and up to one or more centimeters for laser bars and laser arrays, the number of semiconductor chips produced on-wafer, and consequently also the number and dimensions of the temperature distribution structure elements 70, may vary considerably.

Owing to the clearly visible temperature distribution structure elements 70, the chip production process can be very precisely adjusted to the regions having a differing material composition. The temperature distribution structure elements 70 may be produced, for example, in any shape and arrangement by lithographic methods, rendering possible a material composition that is customized to the subsequent semiconductor chips, and consequently a corresponding variation of desired properties on the substrate 6.

Figure 7D:
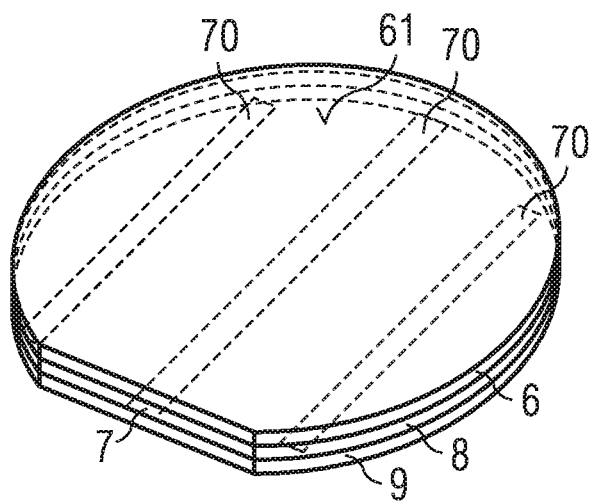

As previously described, the temperature distribution structure 7 may preferably be arranged on the rear side of the substrate 6, which is opposite the surface 61 provided for the growth process, such that the growth process can proceed on the surface 61 without disturbance by the temperature distribution structure 7. As shown in FIGS. 7A and 7C, the temperature distribution structure 7 may be arranged directly on the rear side of the substrate. As an alternative to this, it is possible for the temperature distribution structure 7 to be covered by at least one protective layer, for example made of a dielectric material, or, as shown in FIG. 7D, to be embedded between two such protective layers 8, 9, in order to prevent the growth process from being affected by outgassing and/or vaporization of material from the temperature distribution structure 7. In the exemplary embodiment of FIG. 7D, a first protective layer 8 is arranged between the temperature distribution structure 7 and the substrate 6, while a second protective layer 9 covers the temperature distribution structure 7. The protective layers 8, 9 may have the same or differing materials.

Further features and exemplary embodiments relating to the temperature distribution structure 7 are described in FIGS. 8A to 8K, in which, in this case, respectively only a portion of the substrate 6 and semiconductor material 10 grown thereon, and consequently also of the temperature distribution structure 7 and of the temperature distribution structure elements 70, is shown. In particular, the temperature distribution structure 7 may have a plurality and/or a combination of the temperature distribution structure elements 70 described in the following. The temperature distribution structure elements 70 may have, in particular, a width in the lateral direction, which corresponds to a horizontal direction in the plane of the drawing, that is less than a width of the semiconductor chip to be produced above it. Furthermore, it is also possible for there to be a plurality of temperature distribution structure elements 70 in the region of a semiconductor chip, in order to produce a greater number of regions of differing material composition in the first semiconductor layer. The semiconductor material 10 may have, for example, one or more semiconductor layers grown on the substrate 6.

Figure 8A:
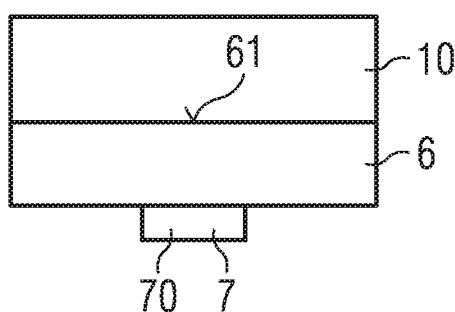

FIG. 8A shows a temperature distribution structure 7, having a temperature distribution structure element 70 that is arranged directly on the rear side of the substrate 6 that faces away from the surface 61. In particular, in the exemplary embodiment shown, the temperature distribution structure element 70 may have a different material than the substrate 6, and be embodied as a heating element that can be heated by being irradiated with suitable electromagnetic radiation, such that the substrate 6, and consequently also the semiconductor material 10 grown thereon, in the region over the temperature distribution structure element 70, can be heated to a higher temperature than in the adjacent regions that are not arranged over the temperature distribution structure element 70. For example, the temperature distribution structure element 70 shown may have a semiconducting material such as, for instance, silicon, which can be heated, for example, by irradiation of light having a wavelength that is in the absorption spectrum of the semiconducting material. As an alternative to this, the temperature distribution structure element 70 may also have, for example, a metal that can be heated by irradiation of suitable electromagnetic radiation such as, for example, microwave radiation.

During the growing of the semiconductor layer sequence, the substrate 6 may be supported, with the temperature distribution structure 7, on a substrate carrier, such that a conduction of heat between the substrate carrier and the substrate 6 can also simultaneously be influenced by the temperature distribution structure 7.

The substrate 6 may have, for example, a typical thickness in the range of from 100 μm to some 100 μm, for example 300 μm, such that the spread of heat in the lateral direction in the substrate 6 can be kept small in extent, and a desired temperature profile can be produced on the surface 61. Since the temperature distribution structure 7 is arranged on the rear side of the substrate 6, there is little chemical influence by the temperature distribution structure 7 during the growing of the semiconductor material 10. Depending on whether the substrate 6 remains, is thinned or removed entirely following the growing of the semiconductor material 10, the temperature distribution structure 7 can also remain in or be removed from the subsequently completed semiconductor chip. In particular, for example in the case of light-emitting diode chips, it is possible for the temperature distribution structure 7 to remain in the chip.

Figure 8B:
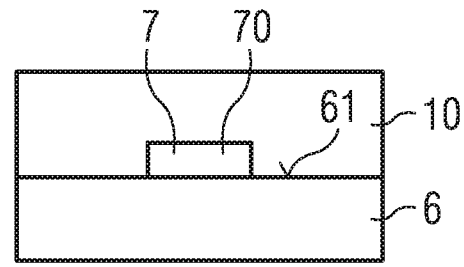

FIG. 8B shows an exemplary embodiment in which, in comparison with the previous exemplary embodiment, the temperature distribution structure 7 is arranged directly on the surface 61 of the substrate 6 that is provided for the process of growing the semiconductor material 10. The temperature distribution structure 7, which may be embodied, for example, as in the previous embodiment, is overgrown in the growing process by the semiconductor material 10, for example by means of a so-called ELOG process (ELOG: epitaxial lateral overgrowth). For this purpose, the temperature distribution structure 7 preferably has a thickness, in the direction of growth, of greater than or equal to 10 nm and less than or equal to 500 nm, or less than or equal to 300 nm, or less than or equal to 200 nm, or particularly preferably, less than or equal to 100 nm. As a result of the temperature distribution structure 7 being arranged on the surface 61 provided for growth, and consequently on the side of the substrate 6 that faces toward the semiconductor material 10, a spreading of heat in the substrate 6 can be avoided, thereby enabling a sharper temperature profile to be achieved. If, following the growing of the semiconductor layer sequence, the substrate 6 is not removed, or is only thinned, the temperature distribution structure 7 can remain in the subsequently completed semiconductor chip.

Figure 8C:
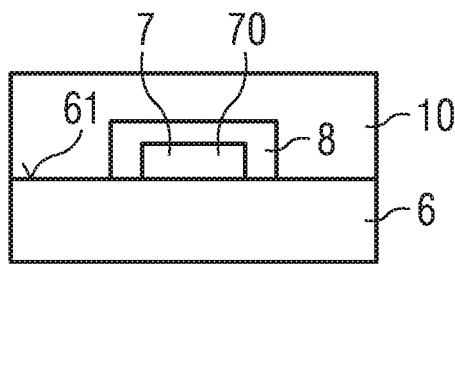

In order to protect the semiconductor material 10 against possible chemical impairment by the temperature distribution structure 7 and nevertheless avoid temperature spreading in the substrate 6, a protective layer 8 of a preferably dielectric material, for example an oxide, nitride or oxynitride, described above in the general part, which, together with the substrate 6, encapsulates the temperature distribution structure element 70, may be applied over the temperature distribution structure 7, as shown in FIG. 8C. For example, the protective layer 8 may be applied by means of an application method such as, for instance, atomic layer deposition, that allows the formation of a layer that is as hermetically sealed as possible with, at the same time, a least possible layer thickness. The protective layer 8 in this case preferably does not extend over the entire surface 61 of the substrate 6, but insofar as possible covers only the elements of the temperature distribution structure 7.

Figure 8D:
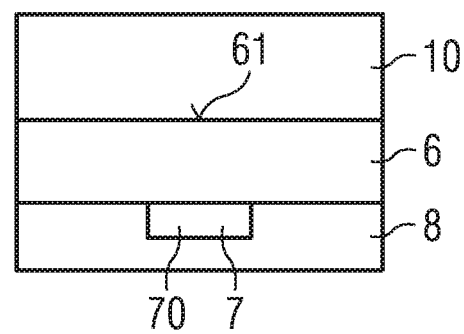

Shown in FIG. 8D is a further exemplary embodiment, in which the temperature distribution structure 7, which is arranged on the rear side of the substrate 6 and which may be embodied as in FIG. 8A, is likewise covered by a protective layer 8, as described in conjunction with FIG. 8C. The protective layer 8 in this case may cover the entire rear side of the substrate 6 or also, as an alternative to the exemplary embodiment shown, only the temperature distribution structure element 70. Apart from avoidance of chemical influencing of the growth process, a suitable protective layer 8 may also be used, for example, to avoid a possible unwanted attachment or adhesion to the substrate carrier.

Figure 8E:
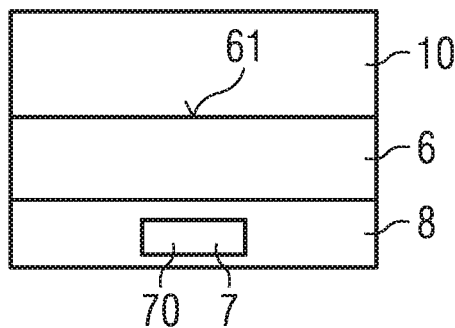

As shown in FIG. 8E, the temperature distribution structure element 70 may also be surrounded on all sides by a protective layer 8, and thus embedded in the latter. In this case, the temperature distribution structure 7 is not directly arranged on the substrate 6. Instead of the design shown, of an embedded protective layer 8, as an alternative to this it is also possible, as described above in conjunction with FIG. 7D, for two protective layers to be used, between which the temperature distribution structure element 70 is arranged.

Figure 8F:
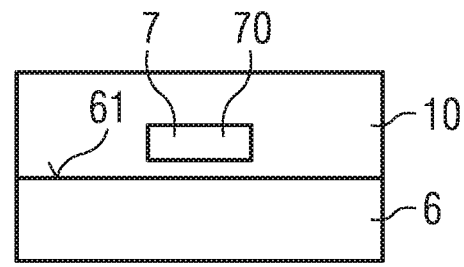
Figure 8G:
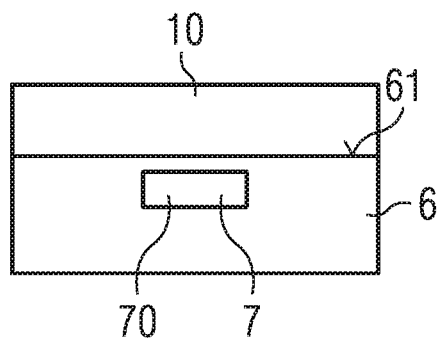

As shown in conjunction with FIGS. 8F and 8G, the temperature distribution structure 7 may also be embedded in the semiconductor material 10 or in the substrate 6. For this purpose, particularly preferably, a semiconductor material having a small band gap may be used to produce corresponding temperature distribution structure elements 70 embodied as heating elements. As an alternative to this, the temperature distribution structure 7 may also have a thermal conductivity that differs from that of the surrounding substrate material 6 or semiconductor material 10, such that the temperature distribution structure element 70 may be embodied as a heat conducting element or thermal barrier element integrated into the substrate 6 or into the semiconductor material 10. The temperature distribution structures 7 shown in FIGS. 8F and 8G may be produced, for example, by implantation. Furthermore, it is also possible for the substrate 6, or the semiconductor material 10 together with the substrate 6, to form a quasi-substrate having over-grown temperature distribution structures 7 and a subsequently planarized surface.

Shown in conjunction with FIGS. 8H to 8K are temperature distribution structures 7 having temperature distribution structure elements 70, which have, or are composed of, one or more elevations and/or recesses. For example, a surface structure having elevations and recesses that form the temperature distribution structure elements 70 may be formed in the rear side of the substrate 6 that faces away from the surface 61. Since the substrate 6 sits only with the elevations on a substrate carrier, the temperature coupling there is better, and consequently the temperature is locally higher in the regions over the elevations than in the regions over the adjacently arranged recesses. A differing thermal coupling of the substrate 6 to the substrate carrier is thus made possible. In this case, the temperature distribution structure elements 70 embodied as elevations may have the same material as the substrate 6 and, particularly preferably, be formed in one piece with the substrate 6.

Figure 8H:
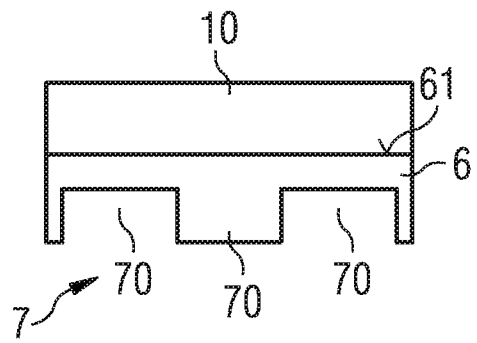
Figure 8I:
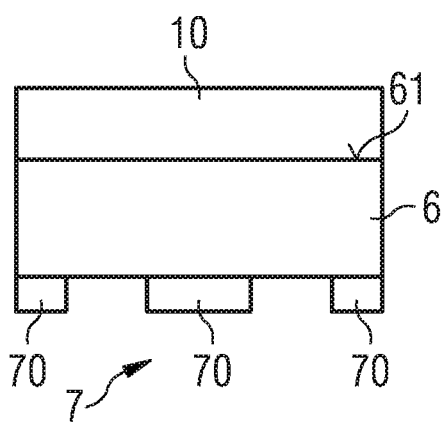

As shown in FIG. 8I, the elevations and recesses formed by the temperature distribution structure 7 may also be composed of a material that is different from the substrate 6.

Figure 8J:
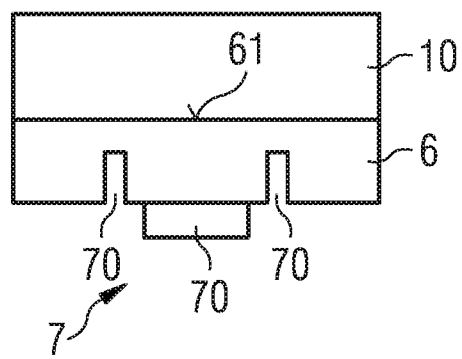

Shown in FIG. 8J is a temperature distribution structure 7 that is a combination of the temperature distribution structures 7 described in conjunction with FIGS. 8A and 8H. On the one hand, a temperature distribution structure element 70 that is embodied as a heating element is arranged on the rear side of the substrate. Additionally provided, in the rear side of the substrate, are temperature distribution structure elements 70 embodied as depressions, which form separating grooves that act as thermal barriers, whereby thermal spread in the substrate 6 can be reduced and a sharper temperature profile can thus be created.

Figure 8K:
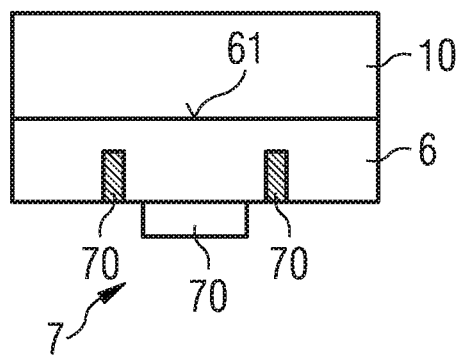

As shown in FIG. 8K, a material having a lesser thermal conductivity than the substrate 6 may additionally be arranged in the recesses on the rear side of the substrate, in order to increase the thermal barrier function of the thus formed temperature distribution structure elements 70.

Figure 9A:
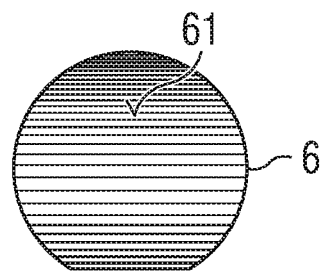
Figure 9B:
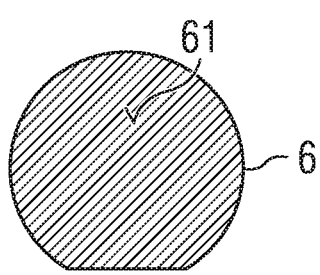
Figure 9C:
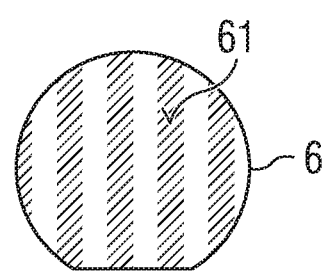

Indicated schematically in FIG. 9A is a typical temperature profile on the surface 61 of a wafer that can be used as a substrate 6 for the method describe here, in a conventional substrate carrier. It can be seen that the temperature distribution is not homogeneous over the substrate surface 61, but varies on a length scale and in lateral directions that depend on the arrangement of the semiconductor chips to be produced on-wafer. A corresponding temperature distribution may also be present, for example, in the growing of the first semiconductor layer. As previously described, this temperature profile affects the material composition of the semiconductor layers of the semiconductor chips, such that the semiconductor chips produced on-wafer may have mutually differing properties. In order to avoid this, the temperature profile on the surface 61 provided for the growth process may be homogenized in an additional method step, as shown in FIG. 9B and, on the basis thereof, as shown in FIG. 9C, set according to the desired inhomogeneous lateral temperature distribution.

As shown in the exemplary embodiments according to the following FIGS. 10A to 10F, in usual coating installations usually a plurality of substrates 6 are arranged on a substrate carrier 200, to enable these substrates to be coated simultaneously. In order to achieve a coating that is as homogeneous as possible, the substrate carrier 200 rotates, as shown by the arrow indicating the rotation direction 201. By means of the substrate carrier 200, the substrates 6 are heated to the desired growth temperature, and there may be inhomogeneous temperature distributions, such as that shown exemplarily in FIG. 9A, present on the surfaces 61. In order to homogenize the respective temperature profile on the surface 61 of the substrate 6, which profile may be different for each substrate 6, this can first be measured, for example by means of an infrared detector.

Figure 10A:
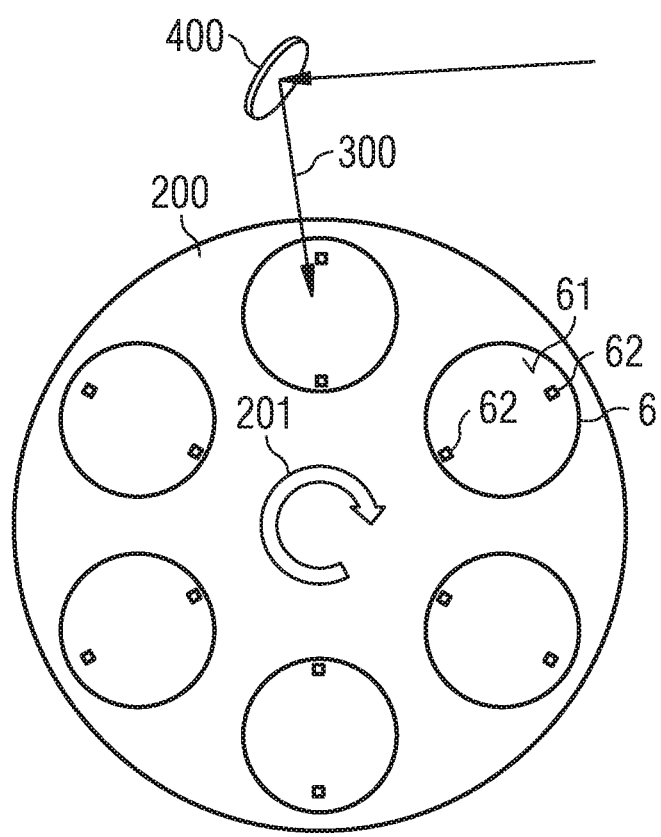
Figure 10B:
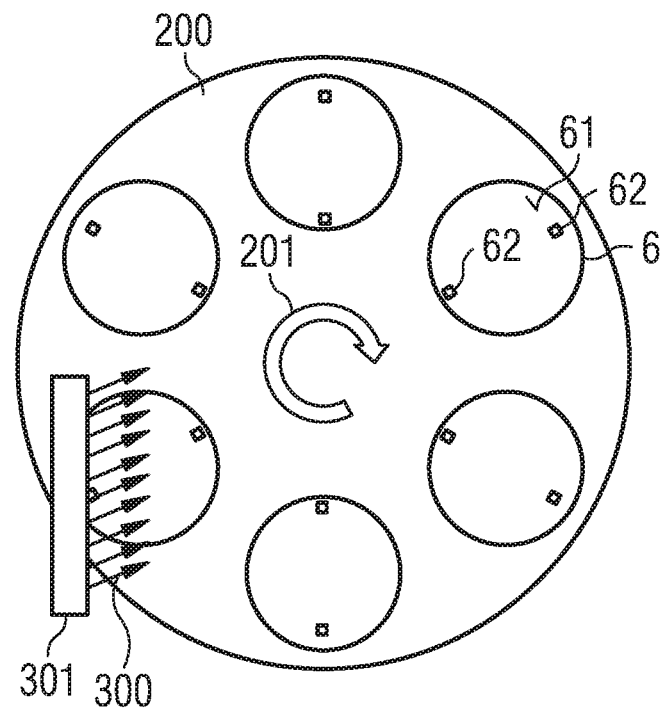
Figure 10C:
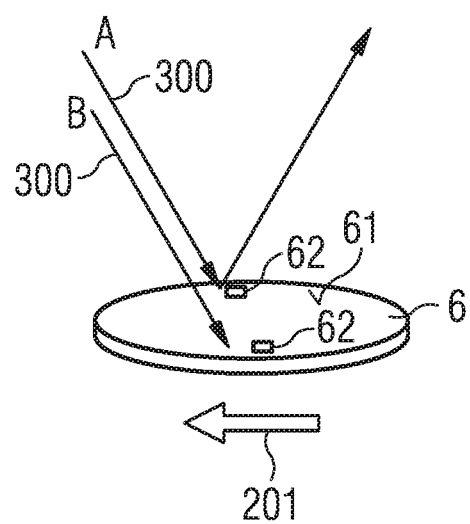

Furthermore, each of the substrates 6 is selectively heated in sub-regions, in order to create, on the respective surface 61 thereof, a temperature profile that is as homogeneous as possible. Such heating may be effected, for example, as shown in FIG. 10A, by means of a locally varying light radiation, i.e. by means of irradiation of a suitably variable light beam 300, which can be absorbed, for example, in the substrate material or a semiconductor material applied to the substrates 6. The light beam may be, for example, a single beam or multiple beam of one or more light sources, and be selectively deflected onto selected sub-regions of the surfaces 61 of the substrates 6 by means of a suitable light deflecting means 400, for instance by means of a mirror or another suitable device. As an alternative to this, as shown in FIG. 10B, it is also possible to use, for example, a plurality of light sources 301, for example a plurality of laser sources in a laser array, which preferably can irradiate light independently of one another onto the surface 61 of a substrate 6. Preferably, the entire surface 61 of the substrates 6 can thereby be covered in each case, the light irradiation being effected with the rotary motion of the substrate carrier 200 and the determined individual temperature profiles of the substrates 6 being taken into account.

The inhomogeneous lateral temperature distribution wanted for growing the first semiconductor layer may be created by means of a previously described temperature distribution structure that is additionally present. As an alternative to this, it is also possible for this to be produced, likewise, by means of the described light irradiation, the heating profile to be effected by the light irradiation being adapted accordingly, in comparison with a pure homogenization of the temperature profile. Moreover, it is also possible for the light heating formed by a locally varying light irradiation to be used, without an additional homogenization step, only to create a desired inhomogeneous temperature profile.

As previously described, the locally varying light irradiation during the growing of the first semiconductor layer may comprise irradiation by means of a laser, which radiates onto the growing first semiconductor layer, in predefined and specifically selected regions, one or more light beams 300, which, as a result of absorption in the growing first semiconductor layer or in a layer underneath, such as, for example, an already grown layer and/or the substrate 6, results in a local and inhomogeneous heating in these regions, such that differing effective growth temperatures prevail in differing regions for the growing first semiconductor layer. The locally varying light irradiation may be realized, in particular, such that one or more regions, whose surface extents are less than those of the semiconductor chips, can be irradiated simultaneously or successively on the substrate 6. The light irradiation in this case may also be effected in a pulsed manner. Scanning of the surface on which the first semiconductor layer is grown is made possible by the described light deflecting means 400 and/or by the use of a plurality of light sources 301.

Figure 10D:
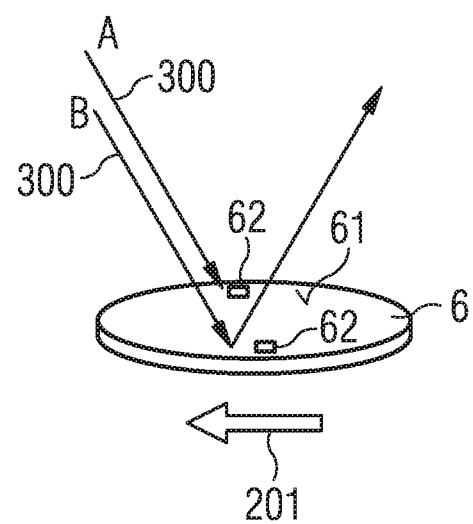
Figure 10E:
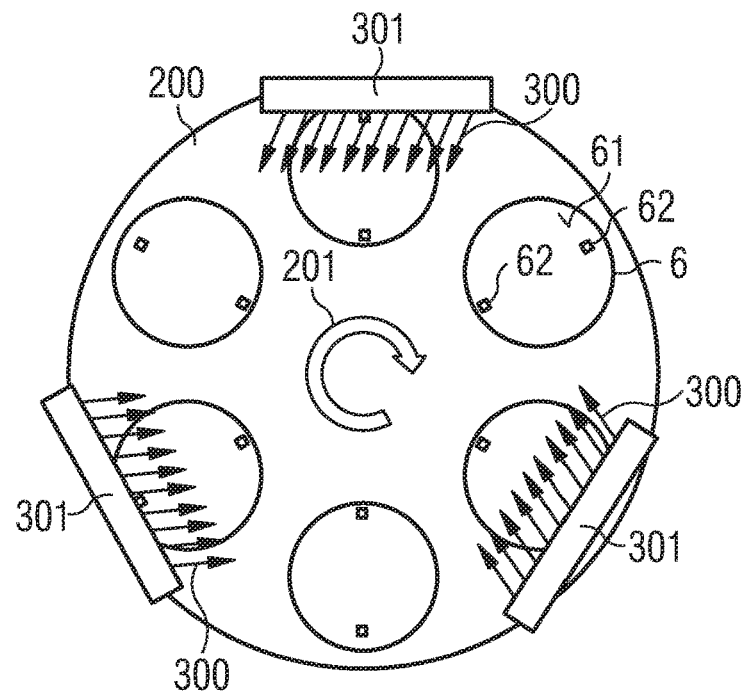

As shown in FIGS. 10A to 10F, the substrates 6 or, alternatively, also the substrate carrier 200 may be formed with at least two markings 62, which serve as reflectors, or adjustment marks, to enable the light beam 300 to be synchronized. As shown exemplarily in FIGS. 10C and 10D, at an instant T1, for example, the light beam 300 denoted by A may strike a marking 62 and be reflected by the latter (FIG. 10C) while, at the same or a later instant T2, the light beam 300 denoted by B strikes a marking 62 and is reflected by the latter (FIG. 10D). The reflected signals from the markings 62 can be used, on the one hand, to enable an exact synchronization of the light beam 300 onto the substrate 6. In addition, it is possible to calculate a rotation of the substrate 6 in the substrate carrier 200 on the basis of the possibly time-delayed signals from the at least two markings 62, and thus to adjust the required temperature profile to correspond to the markings 62. The markings 62 may be used both in a homogenization of the temperature profile and subsequently in the chip process, for adjusting the chip structures to correspond to the temperature profile.

It is also possible to use a plurality of light sources, in the form of a plurality of individual light sources or, as shown in FIG. 10B, in the form of several pluralities of light sources 301, for the purpose of simultaneously heating a plurality of substrates 6. It is thereby possible to achieve a more uniform temperature distribution during the rotation of the substrate carrier 200. Moreover, more power can be applied locally, since a plurality of light sources can illuminate one same region on a substrate 6, such that greater temperature gradients are possible. Furthermore, the local resolution can also be improved by an offset arrangement, for example of a plurality of laser arrays constituted by a plurality of light sources 301.

Figure 10F:
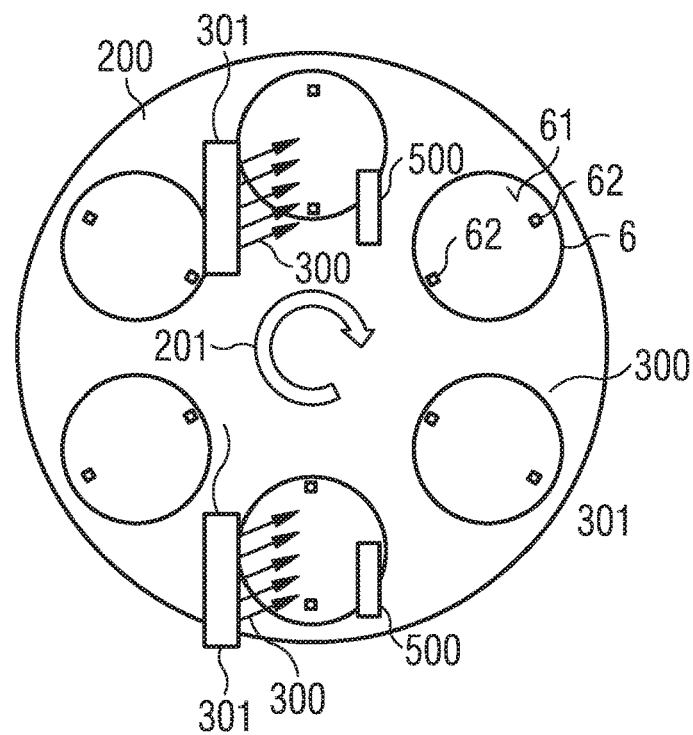

As shown in FIG. 10F, the pluralities of light sources 301 may also illuminate only sub-regions of the substrates 6. This makes it possible, for example, to simplify the assignment of reflected signals from the markings 62. Furthermore, detectors 500 may be arranged on the substrate carrier 200 or in the proximity thereof, to enable direct detection of the signals reflected by the markings 62.

The exemplary embodiments and the features thereof that are described in conjunction with the figures may be combined with one another, according to further exemplary embodiments, even if such combinations are not explicitly described. Furthermore, the exemplary embodiments described in conjunction with the figures may have alternative and additional features, according to the description in the general part.

The description on the basis of the exemplary embodiments does not limit the invention to these exemplary embodiments. Rather, the invention comprises each new feature and each combination of features, this including, in particular, each combination of features in the claims, even if this feature, or this combination itself, is not explicitly stated in the claims or exemplary embodiments.

LIST OF REFERENCES

1 first semiconductor layer
2 second semiconductor layer
3 third layer
4 contact layer
5 passivation layer
6 substrate
7 temperature distribution structure
8, 9 protective layer
10 semiconductor material
11, 12, 13 region
21 ridge waveguide structure
61 surface
62 marking
70 temperature distribution structure element
100 semiconductor chip
200 carrier
201 rotation direction
300 light beam
301 plurality of light sources
400 light deflecting means
500 detector
1000, 2000, 3000 method step

What is claimed is:

1. A semiconductor chip, having a semiconductor layer sequence with a first semiconductor layer, the first semiconductor layer having a lateral variation of a material composition and a constant thickness along at least one direction of extent, wherein
    the semiconductor chip is embodied as a laser diode chip having a laser strip, in which light is generated during operation, and a facet, via which the light is emitted during the operation,
    the first semiconductor layer has at least one first region and has second regions laterally adjacent to the at least one first region,
    the first region and the second regions comprise a same material system,
    a material composition of the first region is different from a material composition of the second regions, wherein the first region and the second regions have a same thickness,
    the first region is formed in a region of the laser strip, and the second regions are formed, in a lateral direction transversely in relation to a direction of extent of the laser strip, on both sides next to the laser strip.

2. The semiconductor chip according to claim 1, wherein a second region of the second regions is embodied as a facet region adjoining the facet, and is formed between the facet and the first region.

3. The semiconductor chip according to claim 2, wherein the material compositions of the first region and the second regions are selected such that an energy gap in the second regions is greater than an energy gap in the first region.

4. The semiconductor chip according to claim 1, wherein the first region adjoins the facet.

5. The semiconductor chip according to claim 4, wherein the material compositions of the first region and the second regions are selected such that an energy gap in the second regions is less than an energy gap in the first region.

6. The semiconductor chip according to claim 1, wherein the laser strip has a width which is defined substantially by the width of a contact region between a contact layer and the semiconductor layer sequence and/or by a ridge waveguide structure in a second semiconductor layer of the semiconductor layer sequence.

7. The semiconductor chip according to claim 6, wherein the first region has a width which substantially corresponds to the width of the laser strip and/or a width of the ridge waveguide structure.

8. The semiconductor chip according to claim 6, wherein the first region has a width which is greater than the width of the laser strip and/or a width of the ridge waveguide structure.

9. The semiconductor chip according to claim 6, wherein the first region has a width which is less than the width of the laser strip and/or a width of the ridge waveguide structure.

10. The semiconductor chip according to claim 1, wherein the semiconductor chip has a ridge waveguide structure.

11. The semiconductor chip according to claim 1, wherein the semiconductor chip is without a ridge waveguide structure.

12. The semiconductor chip according to claim 1, wherein the semiconductor chip has a plurality of laser strips and a plurality of strip-type first regions, which are separated from each other by a plurality of second strips.

13. The semiconductor chip according to claim 1, wherein the first semiconductor layer is at least a part of an active layer.

14. The semiconductor chip according to claim 1, wherein the first semiconductor layer is based on a material system InAlGaN, and an In content is varied for a purpose of the lateral variation of the material composition.

15. The semiconductor chip according to claim 1, wherein the lateral variation of the material composition has, at least partly, a stepped characteristic.

16. The semiconductor chip according to claim 1, wherein the lateral variation of the material composition has, at least partly, a continuous characteristic.

17. A method for producing the semiconductor chip according to claim 1, in which, during a growth process for growing the first semiconductor layer, an inhomogeneous lateral temperature distribution is created along at least one direction of extent of the growing first semiconductor layer, such that the lateral variation of the material composition of the first semiconductor layer is produced.

* * * * *